(12) United States Patent
Patel et al.

(10) Patent No.: US 10,186,661 B2
(45) Date of Patent: Jan. 22, 2019

(54) BLADE COATING ON NANOGROOVED SUBSTRATES YIELDING ALIGNED THIN FILMS OF HIGH MOBILITY SEMICONDUCTING POLYMERS

(71) Applicant: The Regents of the University of California, Oakland, CA (US)

(72) Inventors: Shrayesh N. Patel, Goleta, CA (US); Edward J. Kramer, Santa Barbara, CA (US); Michael L. Chabinyc, Santa Barbara, CA (US); Chan Luo, Santa Barbara, CA (US); Alan J. Heeger, Santa Barbara, CA (US)

(73) Assignee: The Regents of the University of California, Oakland, CA (US)

(*) Notice: Subject to any disclaimer, the term of this patent is extended or adjusted under 35 U.S.C. 154(b) by 0 days.

(21) Appl. No.: 15/058,994

(22) Filed: Mar. 2, 2016

(65) Prior Publication Data

US 2016/0260900 A1    Sep. 8, 2016

Related U.S. Application Data

(60) Provisional application No. 62/127,116, filed on Mar. 2, 2015.

(51) Int. Cl.
*H01L 51/40* (2006.01)
*H01L 51/05* (2006.01)
(Continued)

(52) U.S. Cl.
CPC ...... *H01L 51/0003* (2013.01); *H01L 51/0012* (2013.01); *H01L 51/0026* (2013.01); *H01L 51/0043* (2013.01); *H01L 51/0558* (2013.01)

(58) Field of Classification Search
CPC ............. H01L 51/0003; H01L 51/0008; H01L 51/0012
See application file for complete search history.

(56) References Cited

U.S. PATENT DOCUMENTS 6,060,338 A    5/2000  Tanaka et al.
6,231,927 B1*  5/2001  Ruid .................... B05D 1/42
                                                    118/123
(Continued)

FOREIGN PATENT DOCUMENTS

KR    1020080072929    8/2008
WO    2008/066458      6/2008
(Continued)

OTHER PUBLICATIONS

PCT International Search Report & Written Opinion dated Feb. 14, 2013 for PCT Application No. PCT/US2012/043004.
(Continued)

*Primary Examiner* — Marvin Payen
*Assistant Examiner* — Jeremy Joy
(74) *Attorney, Agent, or Firm* — Gates & Cooper LLP

(57) ABSTRACT

A method for enhancing charge carrier mobility of a field-effect transistor device. The method comprises generating uniaxial nanogrooves on a substrate and blade coating a solution comprising a semiconducting polymer onto the substrate. The polymer solution is spread onto the substrate in a direction parallel to the nanogrooves and a main-chain axis of the polymer is parallel to the nanogrooves. The semiconducting polymer can be then annealed, so that a polymer film is formed which is layered on top of the substrate, with polymer chains aligned parallel to a direction of charge carrier movement.

20 Claims, 20 Drawing Sheets

(51) Int. Cl.
  H01L 51/30    (2006.01)
  H01L 51/00    (2006.01)

(56) References Cited

U.S. PATENT DOCUMENTS

| | | | |
|---|---|---|---|
| 7,585,697 B2* | 9/2009 | Moriya | H01L 51/0012 438/149 |
| 7,847,284 B2* | 12/2010 | Hanna | C08K 5/0008 257/40 |
| 8,343,382 B2 | 1/2013 | Bazan et al. | |
| 8,729,221 B2* | 5/2014 | Bazan | H01L 51/0036 526/257 |
| 9,293,708 B2 | 3/2016 | Bazan et al. | |
| 2004/0247814 A1 | 12/2004 | Sirringhaus et al. | |
| 2004/0248338 A1* | 12/2004 | Sirringhaus | B82Y 10/00 438/99 |
| 2004/0253836 A1 | 12/2004 | Sirringhaus et al. | |
| 2005/0026317 A1* | 2/2005 | Sirringhaus | B82Y 10/00 438/21 |
| 2005/0059168 A1* | 3/2005 | Bazan | C08G 61/02 436/518 |
| 2006/0081882 A1 | 4/2006 | Malenfant et al. | |
| 2007/0014939 A1* | 1/2007 | Gaudiana | B82Y 10/00 428/11 |
| 2007/0264748 A1 | 11/2007 | Sirringhaus | |
| 2008/0275212 A1* | 11/2008 | Heeney | C08G 61/123 528/378 |
| 2009/0001362 A1* | 1/2009 | Toguchi | B82Y 10/00 257/40 |
| 2009/0321721 A1 | 12/2009 | Malenfant et al. | |
| 2010/0180944 A1* | 7/2010 | Gaudiana | B82Y 10/00 136/256 |
| 2010/0311879 A1* | 12/2010 | Rieke | C08G 61/10 524/157 |
| 2011/0003967 A1* | 1/2011 | Amb | C08G 61/122 528/380 |
| 2011/0028656 A1 | 2/2011 | Bazan et al. | |
| 2011/0168264 A1 | 7/2011 | Kastler et al. | |
| 2011/0240973 A1 | 10/2011 | Dueggeli et al. | |
| 2012/0322966 A1 | 12/2012 | Bazan et al. | |
| 2015/0194606 A1* | 7/2015 | Luo | B05C 9/02 257/40 |
| 2015/0214486 A1* | 7/2015 | Tseng | H01L 51/0012 257/40 |

FOREIGN PATENT DOCUMENTS

| | | |
|---|---|---|
| WO | 2008143850 | 11/2008 |
| WO | 2009152165 | 12/2009 |
| WO | 2011/131280 | 10/2011 |
| WO | 2013/142850 | 9/2013 |
| WO | 2015/013747 | 2/2015 |

OTHER PUBLICATIONS

Albrecht et al. "Fluorinated copolymer PCPDTBT with enhanced open-circuit voltage and reduced recombination for highly efficient polymer solar cells" J. Am. Chem. Soc., vol. 134, issue 36, 14932-14944, 2012.
Chen et al. "Highly pi-Extended Copolymer with Diketopyrrolopyrrole Moieties for High-Performance Field-Effect Transistors", Adv. Mater., 2012.
Gin et al. "Tuning charge transport in solution-sheared organic semiconductors using lattice strain", Nature, vol. 480, pp. 504-508, 2011.
Li et al. "High-Mobility Field-Effect Transistors for Large-Area Solution-Grown Aligned C60 Single Crystals", Journal of the American Chemical Society, vol. 134, No. 5, pp. 2760-2765, 2012.
Minemawari et al. "Inkjet printing of single-crystal films", Nature, vol. 475, pp. 364-367, 2011.
PCT International Search Report and Written Opinion dated Aug. 18, 2014 for PCT/US2013/058546.
Shukla et al. "Thin-Film Morphology Control in Naphthalene-Diimide-Based Semiconductors: High Mobility n-Type Semiconductor for Organic Thin-Film Transistors", American Chemical Society, vol. 20, pp. 7486-7491, 2008.
Sundar et al, "Elastomeric Transistor Stamps: Reversible Probing of Charge Transport in Organic Crystals", Science, vol. 303, pp. 1644-1646, 2004.
Tsao et al. "Ultrahigh Mobility in Polymer Field-Effect Transistors by Design", J. Am. Chem. Soc., vol. 133, pp. 2605-2612, 2011.
Tseng et al. "High Mobility Field Effect Transistors Based on Macroscopically Oriented Regioregular Copolymers", Nano Letters [online], vol. 12, iss. 12, 6353-6357, 2012.
Wang et al. "Flexible Organic Thin-Film Transistors with Silk Fibroin as the Gate Dielectric", Adv. Mater. vol. 23, pp. 1630-1634, 2011.
Wang, S. et al. "Organic Field-Effect Transistors based on Highly Ordered Single Polymer Fibers", Adv. Mater., vol. 24, pp. 417-420, 2012.
Zhang, Y. et al. "Significant improved performance of photovoltaic cells made from a partially fluorinated cyclopentadithlophene/benzothiadiazole conjugated polymer", Macromolecules, vol. 45, issue 13, 5427-5435, 2012.
Blouin, N. et al.; Toward a rational design of Poly(2,7-carbazole) Derivatives for Solar Cells; Journal of the American Chemical Society, ACS Publications 2008, 130(2), 732-742.
Fukumoto, H., et al.; Preparation and chemical properties of soluble pi-conjugated poly(arylenethynylene) consisting of azabenzothiadiazole as the electron-accepting unit; J. Polym. Sci. A 2008, 46, 2975.
Welch, G., et al.; Lewis Acid Adducts of Narrow Band Gap Conjugated Polymers; Journal of the American Chemical Society 2011, 133(12), 4632-4644.
Kim, Y., et al.; A strong regioregularity effect in self-organizing conjugated polymer films and high-efficiency polythiophene:fullerene solar cells; Nature Mat. 2006, 5, 197-203.
Marsella, M. J., et al.; Synthesis of regioregular poly(methyl pyridinium vinylene): an isoelectronic analogue to poly (phenylene vinylene); Adv. Mater. 1995, 7, 145-147.
Nambiar, R.; Synthetic approaches to regioregular unsymmetrical dialkoxy-substituted poly(1,4-phenylene ethynylene)s; Macromolecules 2009, 42, 43-51.
Onoda, M.; Lightemitting diodes using n-type conducting polymer: poly(pyridyl vinylene); J. Appl. Phys. 1995, 78, 1327-1333.
Osaka, I.; Advances in molecular design and synthesis of regioregular polythiophenes; Acc. Chem. Res. 2008, 41, 1202-1214.
Supplementary European Search Report for EP Patent Application No. 12801086.5 dated Oct. 10, 2014.
Tian, J., et al.; Electroluminescent properties of self-assembled polymer thin films; Adv. Mater. 1995, 7, 395-398.
Cheng, Yen-Ju, et al.; Dithienocyclopentathieno [3, 2-b] thiophene Hexacyclic Arene for Solution-Processed Organic Field-Effect Transistors and Photovoltaic Applications; Chemistry—An Asian Journal 2012, 7(4), 818-825.
Yamamoto, T., et al.; Preparation and Characterization of Regioregular Head-to-Tail π-Conjugated Poly (pyridine-2,5-diyl)s; Chemistry Letters 2001, 502-503.
Burgi, Lukas, et al.; High-Mobility Ambipolar Near-infrared Light-Emitting Polymer Field-Effect Transistors; Adv Mater. 2008, 20, 2217-2224.
Bijleveld, J. C.; Poly(diketopyrrolopyrrole-terthiophene) for Ambipolar Logic and Photovoltaics; J Am Chem. Soc 2009, 131, 16616-16617.
Li, Yuning, et al.; Annealing-Free High-Mobility Diketopyrrolopyrrole-Quaterthiophene Copolymer for Solution-Processed Organic Thin Film Transistors; J. Am. Chem. Soc. 2011, 133, 2198-2204.
Yan, He, et al.; A High-Mobility Electron-Transporting Polymer for Printed Transistors: Nature, 2009, 457, 679-687.
Son, Hae Jung, et al.; Synthesis of Fluorinated Polythienothiophene-co-benzodithiophenes and Effect of Fluorination on the Photovoltaic Properties; J. Am, Chem. Soc. 2011, 133, 1885-1894.
Liang, Yongye, et al.; For the Bright Future—Bulk Heterojunction Polymer Solar Cells with Power Conversion Efficiency of 7.4%; Adv. Mater. 2010, 22, E135-E138.

(56) References Cited

OTHER PUBLICATIONS

Zhang, Ming, et al.; Field-Effect Transistors Based on a Benzothiadiazole-Cyclopentadithiophene Copolymer; J Am. Chem. Soc. 2007, 129, 3472-3473.
Tsao, Hoi Nok, et al.; The Influence of Morphology on High-Performance Polymer Field-Effect Transistors: Adv. Mater, 2009, 21, 209-212.
Bronstein, Hugo, et al,: Synthesis of a Novel Fused Thiophene-thieno (3, 2-b) thiophene-thiophene Donor Monomer and Co-polymer for Use in OPV and OFETs; Macromolecular rapid communications 2011, 32(20), 1664-1668.
Welch, Gregory C., et al.; Band Gap Control in Conjugated Oligomers via Lewis Acids; J. Am, Chem. Soc 2009, 131, 10802-10803.
Zhou, Huaxing, et al.; Enhanced Photovoltaic Performance of Low-Bandgap Polymers with Deep LUMO Levels; Angew. Chem. Int. Ed. 2010, 49, 7992-7995.
Yamamoto, Takakazu, et al.; Copolymers of Thiophene and Thiazole. Regioregulation in Synthesis, Stacking Structure, and Optical Properties; Macromolecules 2003, 36, 7986-7993.
Tilley, Jefferson W., et al.; A Convenient Palladium-Catalyzed Coupling Approach to 2,5-Disubstituted Pyridines; J. Org. Chem. 1988, 53, 386-390.
Schroter, Sven, et al.; Regioselective cross-coupling reactions of multiple halogenated nitrogen-, oxygen-, and sulfur-containing heterocycles; Tetrahedron, 2005, 61, 2245-2267.
Handy, Scott T., et al.; Disubstituted Pyridines: The Double-Coupling Approach: J. Org. Chem. 2007, 72, 8496-8500.
Coffin, Robert C., et al.; Streamlined microwave-assisted preparation of narrow-bandgap conjugated polymers for high-performance bulk heterojunction solar cells; Nat. Chem. 2009, 1, 657-661.
Sun, Ying, et al.; High-mobility low-bandgap conjugated copolymers based on indacenodithiophene and thiadiazolo [3,4-c]pyridine units for thin film transistor and photovoltaic applications; Mater Chem 2011, 21, 13247-13255.
Ying, Lei, et al.; Regioregular Pyridal[2,1,3]thiadiazole pi-Conjugated Copolymers; J. Am. Chem. Soc. 2011, 133, 18538-18541.
Liu, Fengmin, et al.; Efficient polymer photovoltaic cells using solution-processed $MoO_3$ as anode buffer layer; Solar Energy Materials & Solar Cells. 2010, 94, 842-845.
Wang, Ming, et al.; Donor-Acceptor Conjugated Polymer Based on Naphtho[1,2-c:5,6-c]bis[1,215]thiadiazole for High-Performance Polymer Solar Cells; J. Am. Chem. Soc. 2011, 133, 9638.
Zhang, Weimin, et al.; Indacenodithiophene Semiconducting Polymers for High-Performance, Air-Stable Transistors: J. Am. Chem. Soc. 2010, 132, 11437.
Berson, S., et al.: Effect of carbonitrile and hexyloxy substituents on alternated copolymer of polythiophene-Performances in photovoltaic cells; Solar Energy Materials and Solar Cells, 2010, 94, 699-708.
Gao, Peng, et al., Heteroheptacenes with fused thiophene and pyrrole rings; Chemistry—A European Journal 2010, 16 (17), 5119-5128.

\* cited by examiner

FIG. 1A
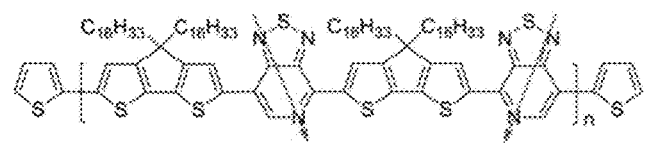
FIG. 1B
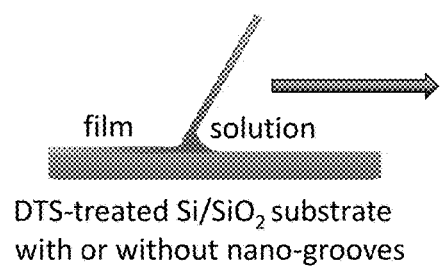
DTS-treated Si/SiO₂ substrate
with or without nano-grooves
FIG. 1C
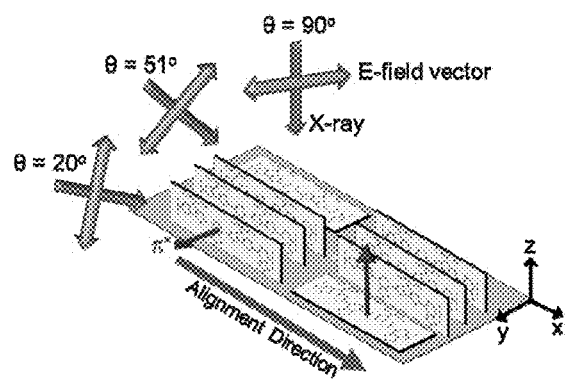
Perpendicular Configuration
FIG. 1D
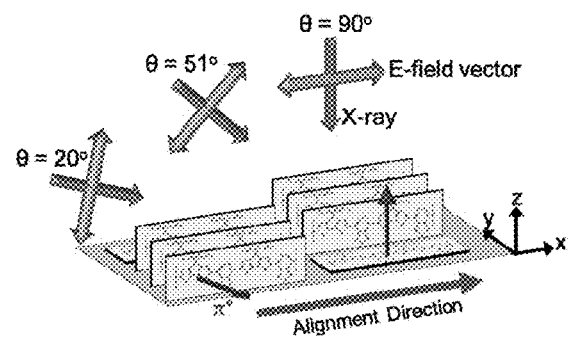
Parallel Configuration
FIG. 1

FIG. 3A
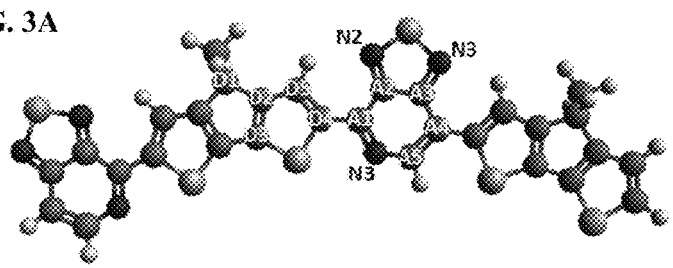
FIG. 3B
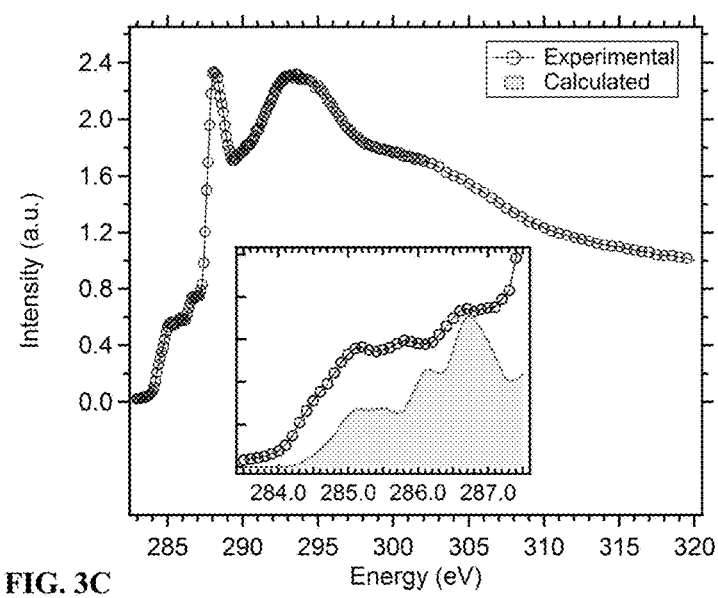
FIG. 3C
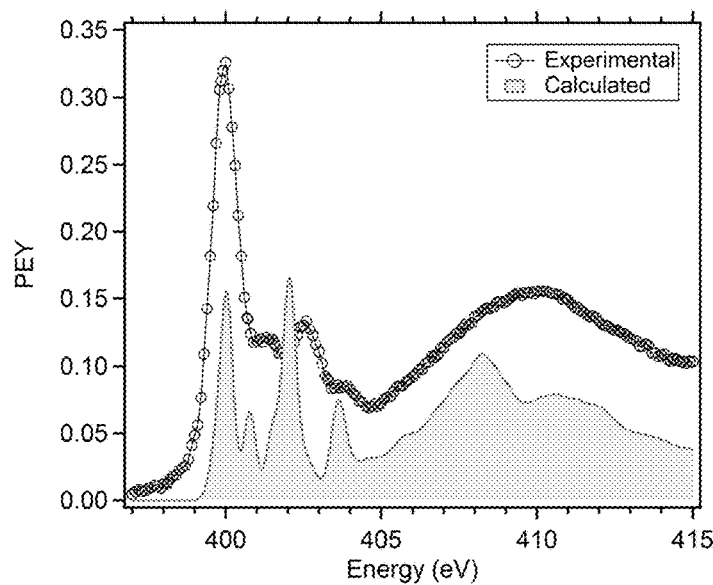
FIG. 3

FIG. 8A
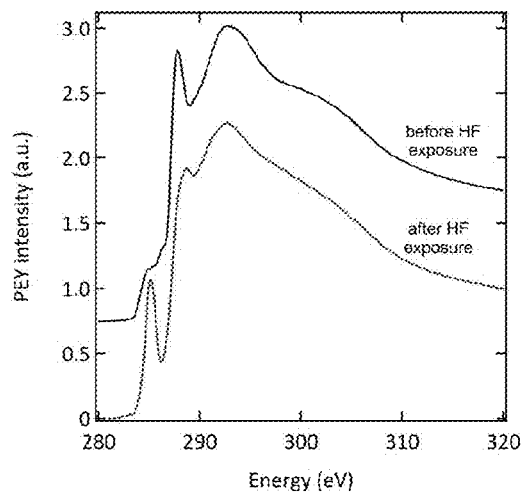
FIG. 8B
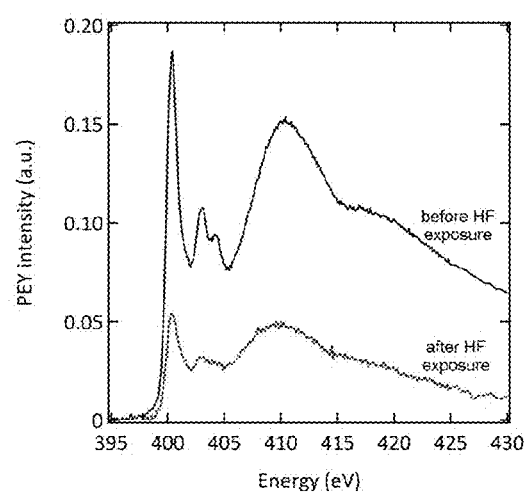
FIG. 8C
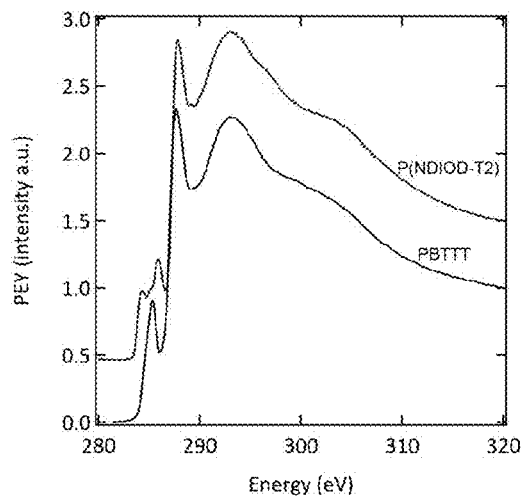
FIG. 8D
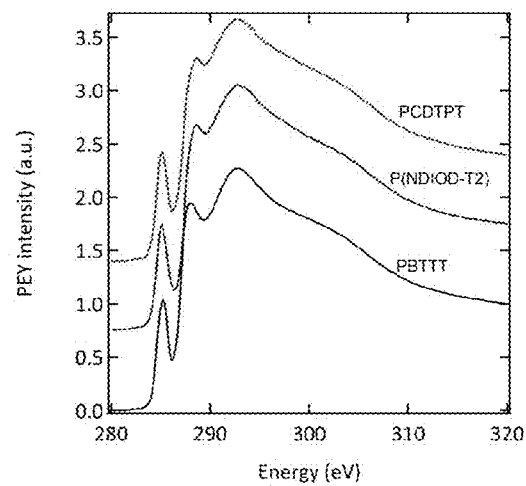
FIG. 8

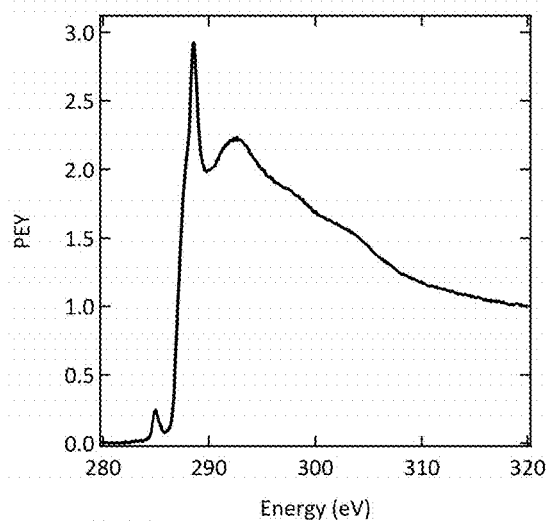
FIG. 9A
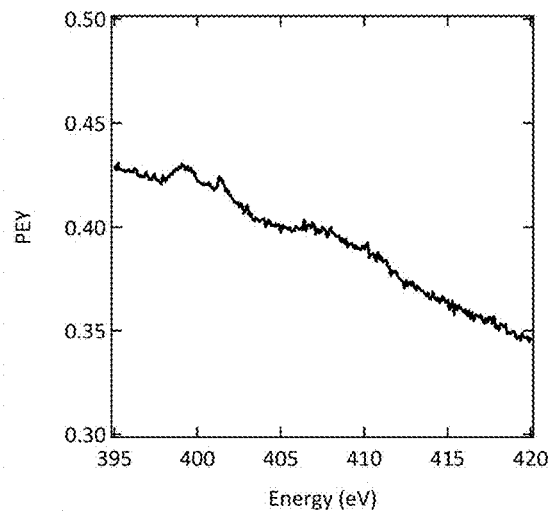
FIG. 9B
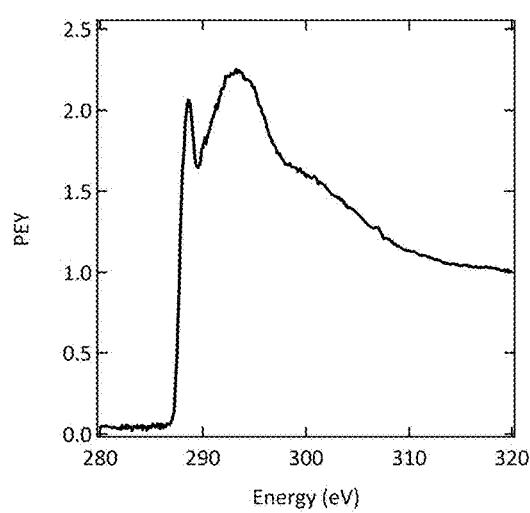
FIG. 9C
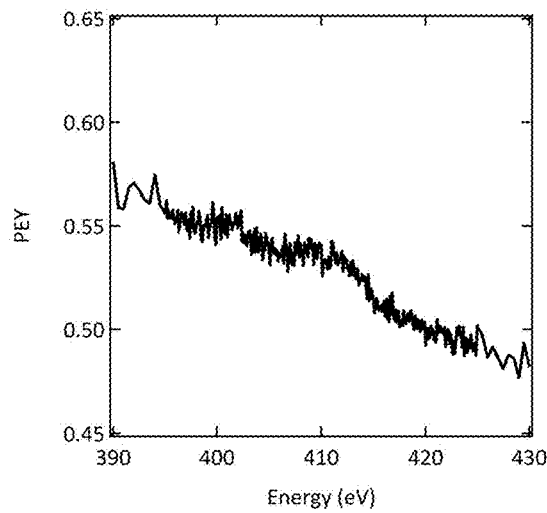
FIG. 9D
FIG. 9

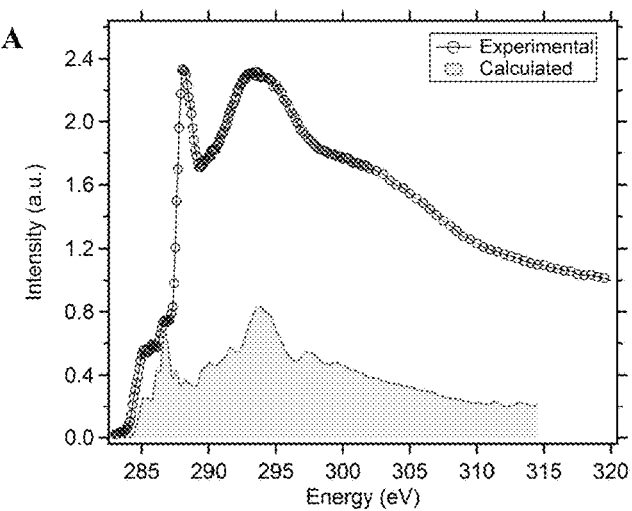
FIG. 12A
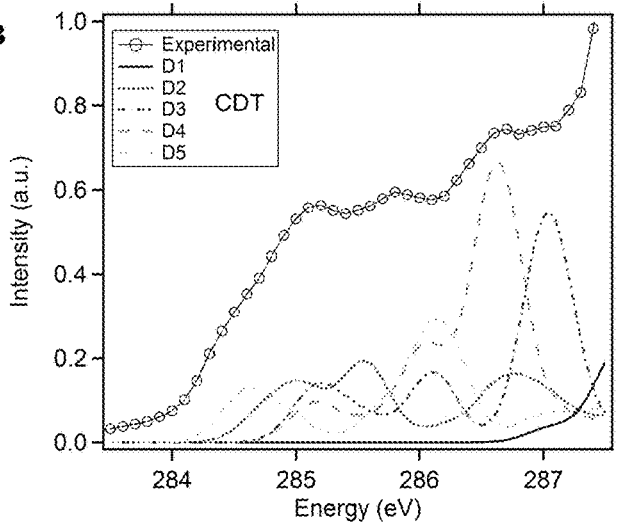
FIG. 12B
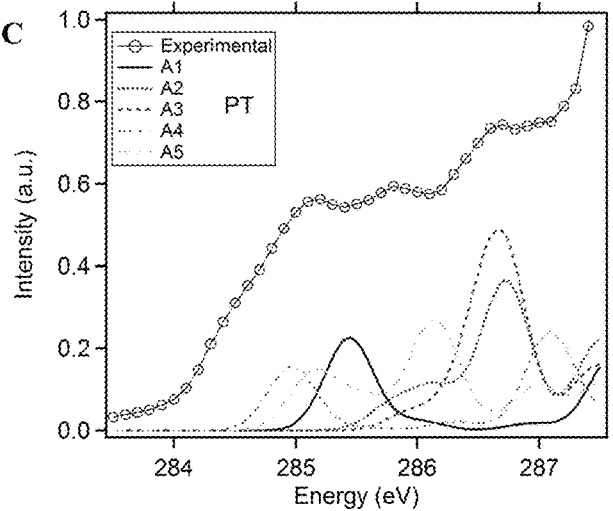
FIG. 12C
FIG. 12

FIG. 13A
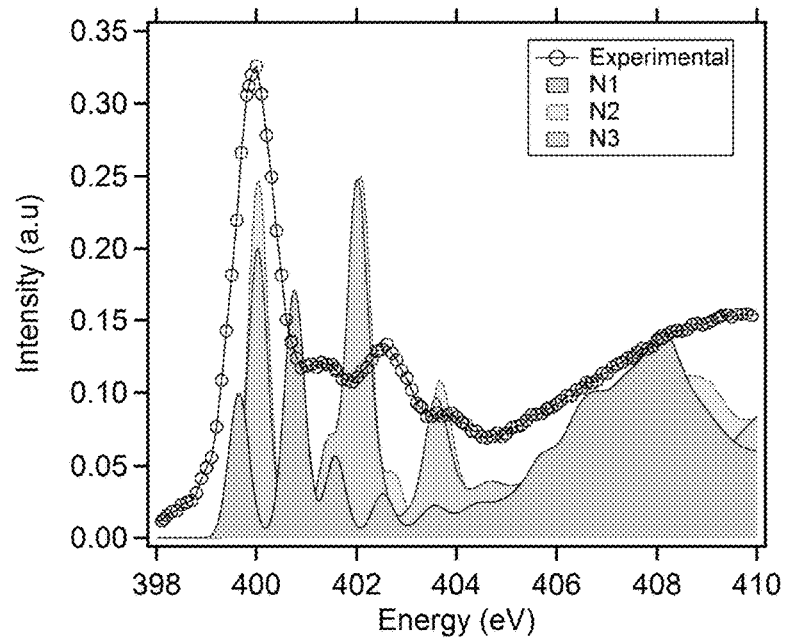
FIG. 13B
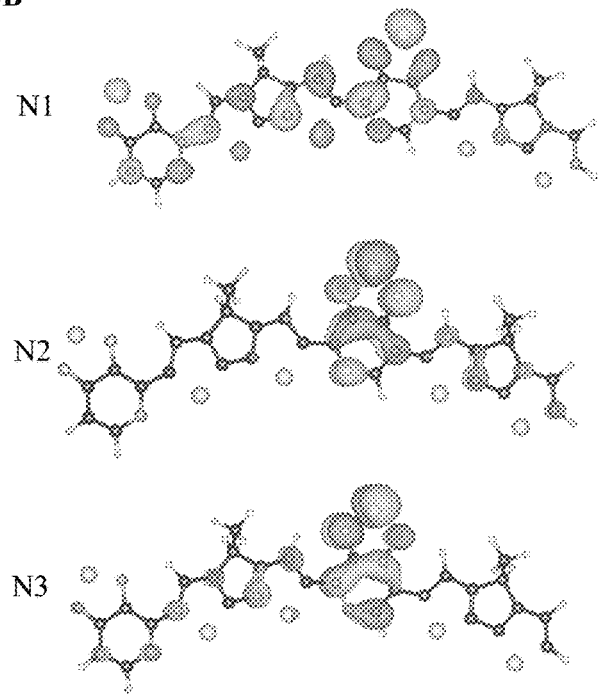
FIG. 13

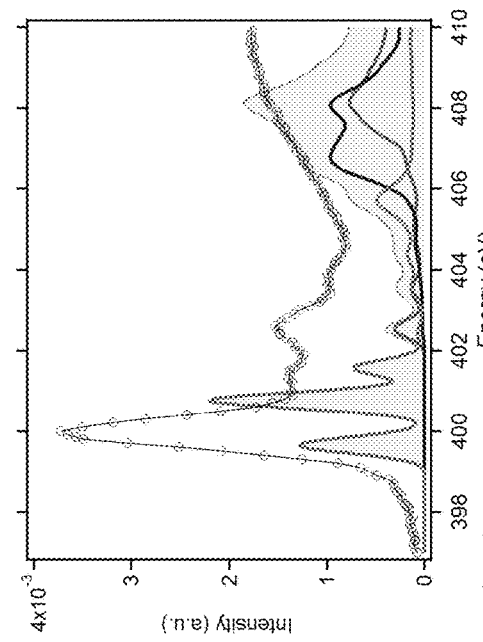
FIG. 14A
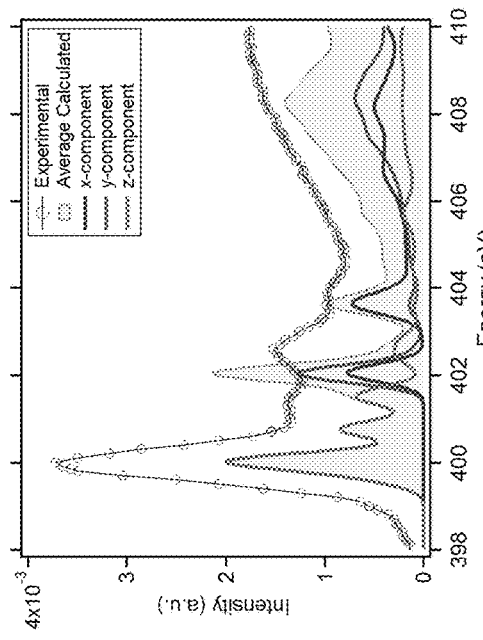
FIG. 14B
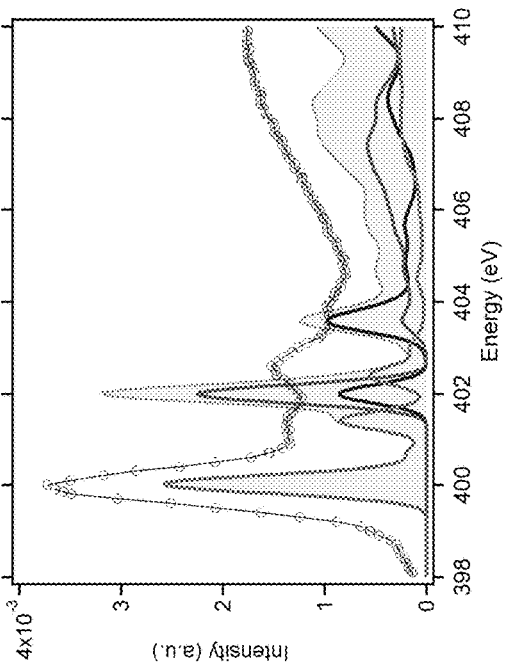
FIG. 14C
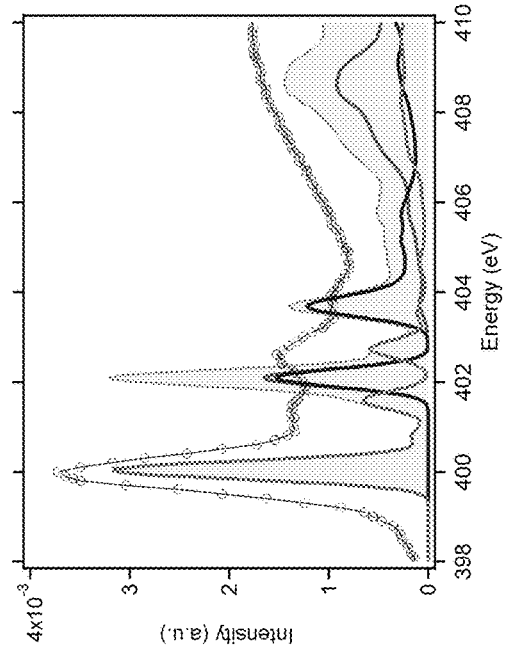
FIG. 14D
FIG. 14

FIG. 15A
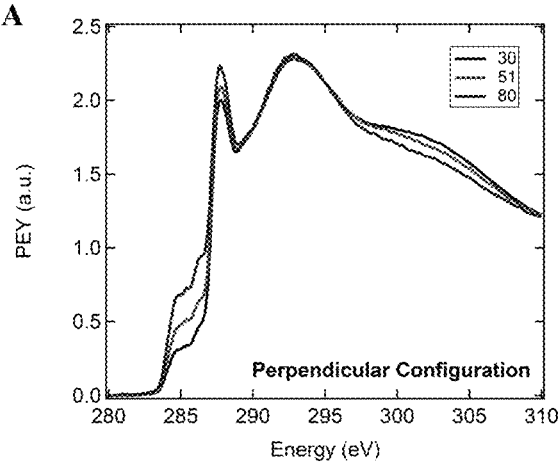
FIG. 15B
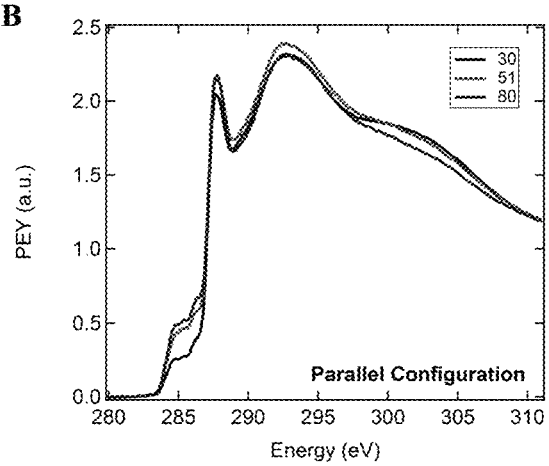
FIG. 15C
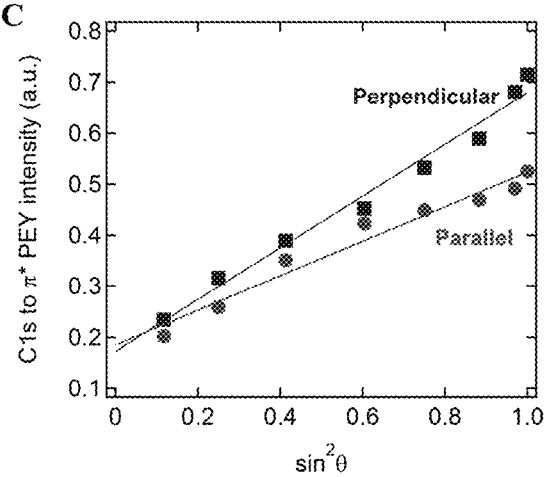
FIG. 15

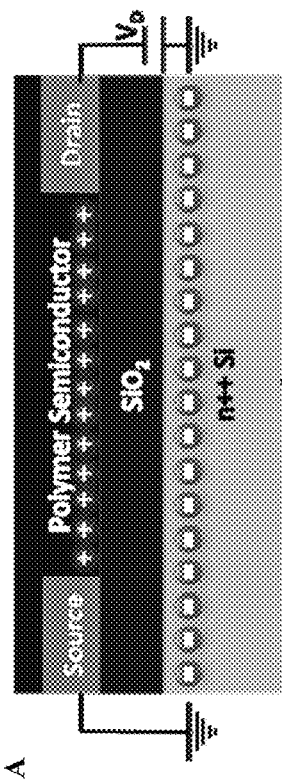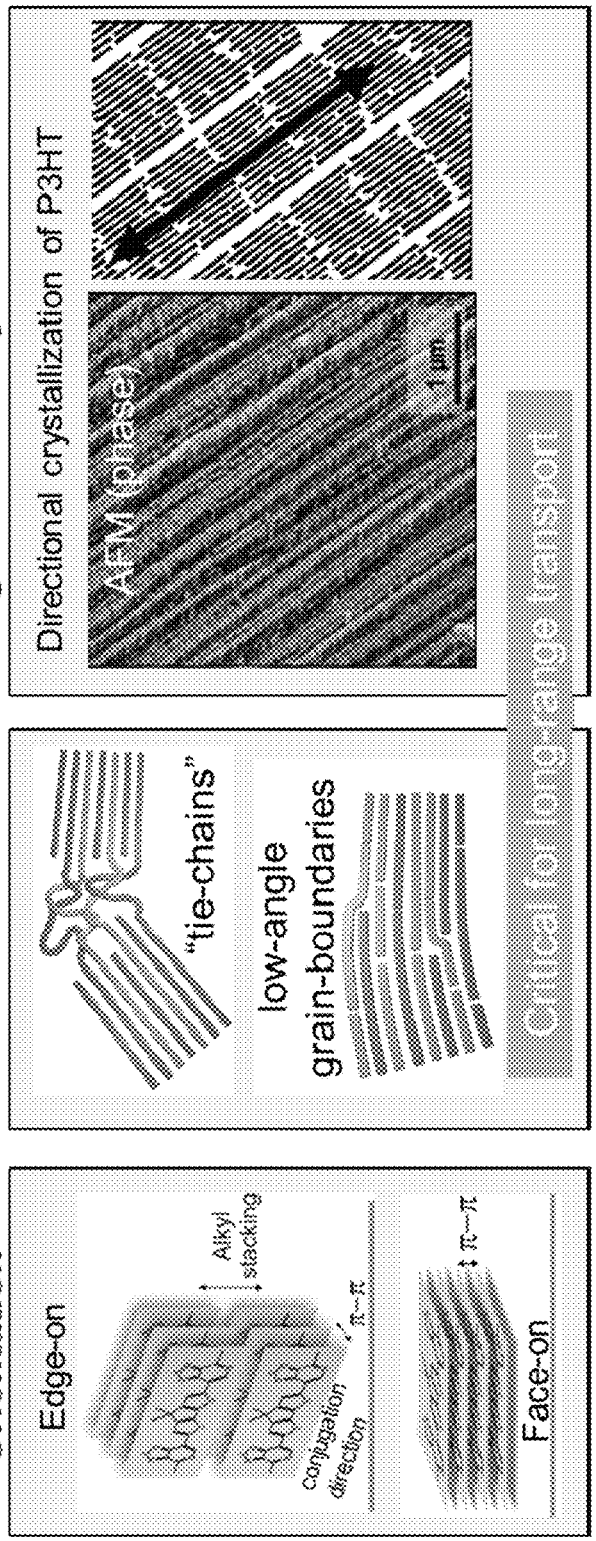
FIG. 19A
FIG. 19B
FIG. 19C
FIG. 19D
FIG. 19

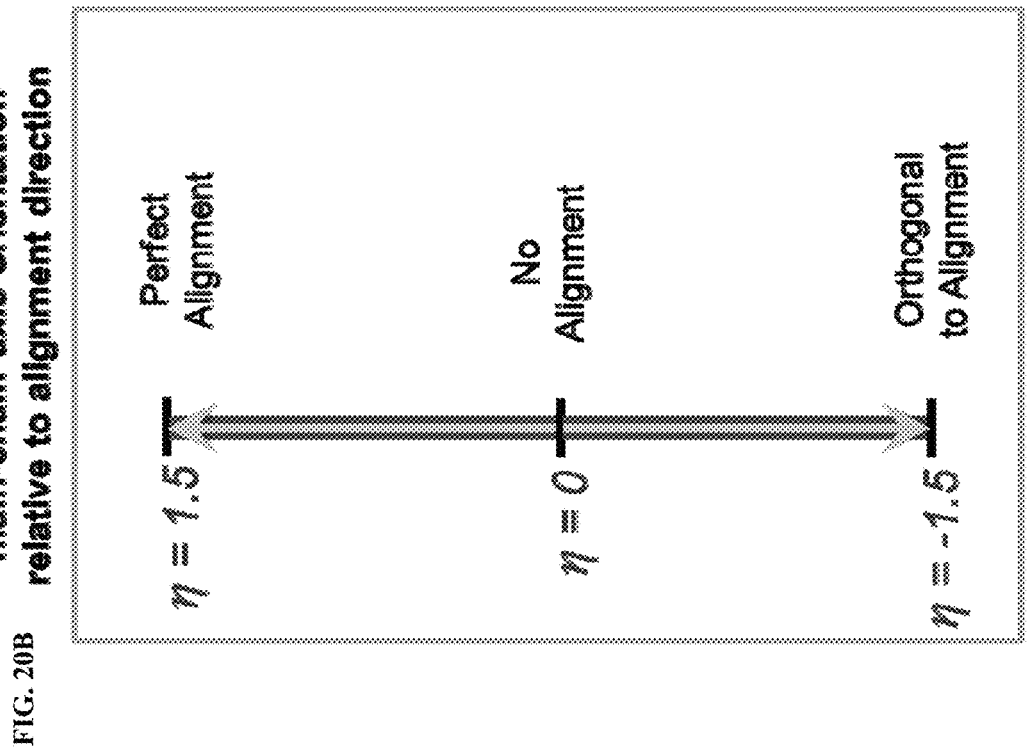
FIG. 20A
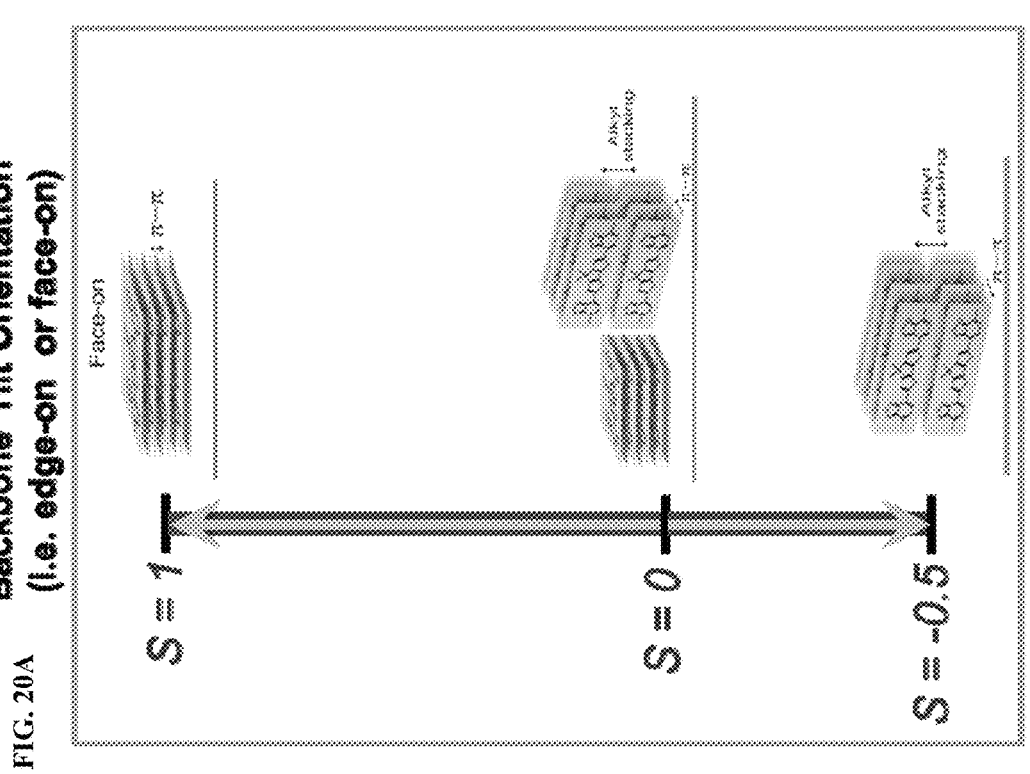
FIG. 20B
FIG. 20

BLADE COATING ON NANOGROOVED SUBSTRATES YIELDING ALIGNED THIN FILMS OF HIGH MOBILITY SEMICONDUCTING POLYMERS

CROSS-REFERENCE TO RELATED APPLICATIONS

This application claims priority under 35 U.S.C. Section 119(e) from U.S. Provisional Application Ser. No. 62/127,116 filed on Mar. 2, 2015 by Shrayesh N. Patel et al., entitled "BLADE COATING ON NANOGROOVED SUBSTRATES YIELDING ALIGNED THIN FILMS OF HIGH MOBILITY SEMICONDUCTING POLYMERS", the contents of which are incorporated herein by reference.

TECHNICAL FIELD

The invention relates to field-effect transistor devices and in particular processes for coating semiconducting polymer films.

BACKGROUND OF THE INVENTION

The semiconducting nature of conjugated polymers are of great interest for a variety of organic applications such as organic field-effect transistors (OFETs). To be viable for real applications such as flexible displays, a major focus has been on enhancing charge carrier mobility. Significant advances have been made in the molecular design of conjugated polymers, which have yielded improved electronic properties and crystalline morphologies that further enhance carrier mobility.' Aligning conjugated polymers is a common route to enhance charge carrier mobility. A large number of techniques have been applied to obtain aligned films, which increases charger carrier mobility due to fewer grain boundaries and higher intrachain charge transport.[2-19] Some of these methods include a rubbed polyimide surface as an alignment layer,[3,20] directional crystallization,[10,21] high temperature rubbing,[18,19] and flow-coating methods.[11,14,17]

One group has proposed an alternative method of alignment where films are coated on substrates with uniaxial nanogrooves.[22-24] Simply rubbing the substrate with a diamond lapping paper generates the nanogrooves, which are approximately 100 nm in width and few nm in depth. To coat films on the nanogrooved substrates, this group developed a "sandwich casting" method.' Regioregular PCDTPT,[25] which is a donor-acceptor copolymer of a cyclopenta[2,1-b:3,4-b']dithiophene (CDT) donor unit and a [1,2,5]thiadiazolo[3,4-c]pyridine (PT) acceptor unit, was cast using the "sandwich casting" method to yield highly aligned films with high field-effect mobility[23,24] (e.g. at least 20 cm$^2$/V·s). The resulting films are semicrystalline and form long fiber-like bundle structures, which are preferentially aligned along the nanogrooves.[23] The main-chain axis of the polymer (i.e. the direction along the length of the conjugated polymer chain axis) is parallel to the long-axis of the fiber while the π-π stacking direction is along the short-axis of the fiber, thus allowing for efficient intrachain and interchain charge transport.[23] Although the sandwich casting method yields macroscopically aligned films with high field-effect mobility, the long casting time (~8 hrs)[24] is not practical to scale-up for the large-scale manufacturing needs of the "plastic electronics" industry. Therefore, a more industrial applicable method of forming aligned semiconducting polymer films, such as PCDTPT thin films, on uniaxial nanogrooved substrates is needed.

SUMMARY OF THE INVENTION

An important aspect of the commercialization of organic electronics is the development of improved coating or printing processes. In this context, embodiments of the invention provide an optimized industrial applicable flow-coating method for aligning semiconducting polymer films on nanogrooved substrates. In specific embodiments, the invention provides a coating process known as "blade coating" or "doctor blading" for forming aligned polymer thin films, such as PCDTPT films, on uniaxial nanogrooved substrates. The blade coating parameters disclosed herein establish a crucial framework for the large-scale manufacturing of field-effect transistors with high charge carrier mobility. In a related aspect of the invention, the determination of order parameters to quantify the extent of alignment is also described.

Illustrative embodiments of the invention include methods for enhancing charge carrier mobility of a field-effect transistor device. The method typically comprises generating uniaxial nanogrooves on a substrate and blade coating a solution comprising a semiconducting polymer onto the substrate. The nanogrooves provide sites that induce alignment of the polymer chains. In certain instances, the uniaxial nanogrooves are approximately 100 nm in width and/or 2 nm in depth. The polymer solution is spread onto the substrate in a direction parallel to the nanogrooves and a main-chain axis of the polymer is parallel to the nanogrooves. In certain embodiments of the invention, the surface of the substrate and/or the blade can be further treated so as to attract or repel the polymer solution. The cast semiconducting polymer can then be annealed, so that a polymer film can be formed, layered on top of the substrate and having polymers aligned parallel to a direction of charge carrier movement (i.e. parallel to the nanogrooves).

In the methods disclosed herein, the polymer crystallizes to form a fiber having a long-axis and a short-axis, and the main-chain axis of the polymer is parallel to the long-axis of the fiber while π-π stacking is in a direction along the short-axis of the fiber. In certain embodiments of the invention, a tilt, S, of the polymer main-chain axis relative to a normal of the substrate is less than or equal to −0.35 and an orientation, η, of the polymer main-chain axis relative to the alignment direction is greater than or equal to 0.96. In one specific embodiment, the polymer is a donor-acceptor copolymer of a cyclopenta[2,1-b:3,4-b']dithiophene (CDT) donor unit and a [1,2,5]thiadiazolo[3,4-c]pyridine (PT) acceptor unit.

In certain embodiments of the invention, the blade used for blade coating the solution is positioned at a 60° angle to the substrate and 150 μm above the substrate. In other embodiments, the polymer solution is blade coated onto the substrate at a rate of 0.6 mm/s and at a temperature of 80° C. In still other embodiments, the polymer film is annealed at 200° C. In further embodiments, the annealed polymer film has a thickness between 25-35 nm. The solvent of the organic semiconductor solution can be known in the art to be useful for such purposes. Illustrative but is not limiting examples of such solvents include tetrahydrofuran, toluene, o-xylene, p-xylene, xylenes, chlorobenzene, 1,2-dichlorobenzene, 1,2,4-triclorobenzene, and chloroform. Other methods to provide the flow of the organic semiconductor solution to coat the substrate can be, but are not limited to, slot die coating or curtain coating processes.

Other objects, features and advantages of the present invention will become apparent to those skilled in the art from the following detailed description. It is to be understood, however, that the detailed description and specific examples, while indicating some embodiments of the present invention are given by way of illustration and not limitation. Many changes and modifications within the scope of the present invention can be made without departing from the spirit thereof, and the invention includes all such modifications.

BRIEF DESCRIPTION OF THE DRAWINGS

Referring now to the drawings in which like reference numbers represent corresponding parts throughout:

FIG. 1 illustrates (FIG. 1A) a regioregular PCDTPT; (FIG. 1B) blade-coating schematic where the blade angle is set to 60° and gap-height is 150 µm, in accordance with one or more embodiments of the invention. Polarization-dependent NEXAFS experiment geometry for (FIG. 1C) perpendiuclar and (FIG. 1D) parallel configurations are also illustrated. In the perpendicular configuration, the electric field vector is "perpendicular" to the alingment direction at normal incident angle ($\theta$=90°) and the sample is rotated about the x-axis (alignment axis) to study the polarization dependence. For the parallel configuration, the sample is first rotated 90° about the z-axis. As a result, at $\theta$=90°, the electric field vector is "parallel" to the alignment direction. Then, the sample is rotated about the y-axis (orthogonal to the alingment axis) to study the polarization dependence. Red arrows correspond to the is to 1 s $\pi^*$ transition dipole moment. The alignment direction is parallel to the nanogrooves (i.e. parallel to coating direction). This example is for a film with perfect alignment and primarly edge-on orientation.

(FIG. 2C) The in-plane and out-of-plane line cuts. The (h00) reflections relating to the lamellar stacking are primarily out-of-plane while the (010) corresponding to the $\pi$-$\pi$ stacking peak are in-plane, thus indicating an edge-on orientation. (FIG. 2D) The near in-plane line cuts for both parallel and perpendicular GIWAXS patterns. The higher intensity of the (010) peak in the parallel case provides preliminary confirmation of preferential alignment in the film. In addition to the (100) and (010) reflections, the three additional reflections (arrows) are seen at q~11.1 nm$^{-1}$, q~14.5 nm$^{-1}$, and q~16.4 nm$^{-1}$ (FIG. 11).

FIG. 3 illustrates (FIG. 3A) PCDTPT and (FIG. 3B) a representative C k-edge spectrum for PCDTPT, in accordance with one or more embodiments of the invention. The inset shows the comparison between the experimental and calculated spectrum in the region of $\pi^*$ resonances. (FIG. 3C) Representative N k-edge spectrum for PCDTPT and the corresponding calculated N k-edge spectrum.

(FIG. 5C) shows the peak intensity of the N 1 s to $\pi^*$ resonance at ~400 eV as a function of $\sin^2\theta$. The solid markers are the experimental results and the solid lines are linear fits.

FIG. 8 illustrates (FIG. 8A) C K-edge and (FIG. 8B) N K-edge NEXAFS spectra of PCDTPT thin film before and after exposure to HF, in accordance with one or more embodiments of the invention. The curves were offset along the y-axis for clarity in the C K-edge spectra (no shift was applied to the N K-edge curves). (FIG. 8C) C K-edge NEXAFS spectra of P(NDIOD-T2) and PBTTT thin film before HF exposure and (FIG. 8D) after HF exposure.

FIG. 9 illustrates (FIG. 9A) C k-edge PEY spectrum and (FIG. 9B) N k-edge spectrum of the pressure-sensitive adhesive; (FIG. 9C) C k-edge PEY spectrum and (FIG. 9D) N k-edge spectrum from a substrate after delamination of the film using the pressure-sensitive adhesive, in accordance with one or more embodiments of the invention.

FIG. 12 illustrates (FIG. 12A) full C k-edge spectrum comparing experimental and theoretical results, in accordance with one or more embodiments of the invention. Calculated NEXAFS spectra for each excited carbon in (FIG. 12B) the CDT unit and (FIG. 12C) in the PT unit.

FIG. 13 illustrates (FIG. 13A) N K-edge spectrum comparing experimental and theoretical results for each excited N, in accordance with one or more embodiments of the invention. (FIG. 13B) The LUMO molecular orbital for the (400 eV transition state) for each N.

FIG. 14 illustrates (FIG. 14A) N K-edge theoretical calculation for the x,y,z components for (FIG. 14A) the total average spectrum, (FIG. 14B) from N1, (FIG. 14C) from N2, and (FIG. 14D) from N3, in accordance with one or more embodiments of the invention.

FIG. 15 illustrates C K-edge PEY data for the top-side of a film blade coated on a nanogrooved substrates at 0.3 mm/s, in accordance with one or more embodiments of the invention. Scans were taken at $\theta$=20, 30, 40, 51, 60, 70, 80, 90 in the (FIG. 15A) perpendicular and (FIG. 15B) parallel configurations. (FIG. 15C) shows the peak intensity of the C is to $\pi^*$ resonance at ~285.2 eV as a function of $\sin^2\theta$. The solid markers are the experimental results and the solid lines are linear fits.

perpendicular and (FIG. 16B) parallel configurations. (FIG. 16C) shows the peak intensity of the N 1 s to π* resonance at ~400 eV as a function of $\sin^2\theta$. The solid markers are the experimental results and the solid lines are linear fits.

FIG. 19 illustrates the alignment for enhanced charge carrier transport in organic field-effect transistors. FIG. 19A shows a structure of a field-effect transistor. FIG. 19B illustrates edge-on (top) and face-on (bottom) backbone tilt orientations. FIG. 19C illustrates tie-chains (top) and low-angle grain boundaries (bottom). FIG. 19D illustrates an alignment of a polymer backbone with the directional crystallization of P3HT. An atomic force microscope (AFM) phase image is shown (left) along with a simplified representation (right).

FIG. 20 illustrates the quantitative limits of order parameters, S and η. FIG. 20A illustrates backbone tilt orientation (i.e. edge-on or face-on) with S between −0.5 and 1. FIG. 20B illustrates main-chain axis orientation relative to alignment direction with η between −1.5 and 1.5.

DETAILED DESCRIPTION OF THE INVENTION

Figure 2:
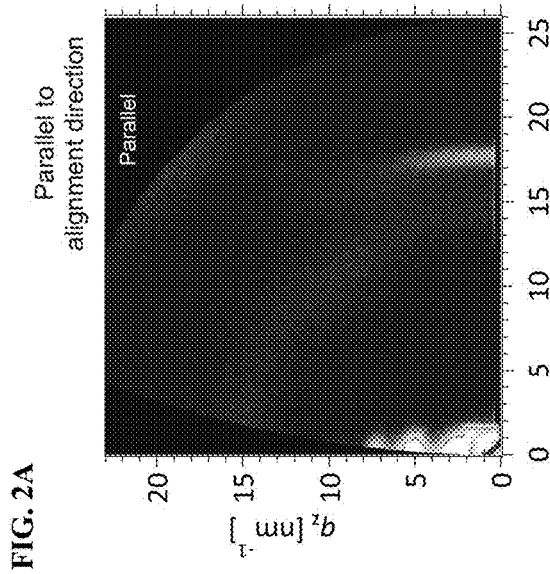
FIG. 2 illustrates the GIWAXS patterns for the case where the grazing incident X-ray is (FIG. 2A) parallel to the alignment direction and (FIG. 2B) perpendicular to the alignment direction, in accordance with one or more embodiments of the invention. These patterns are for a film blade coated at 0.3 mm/s on nanogrooved substrates.
Figure 2:
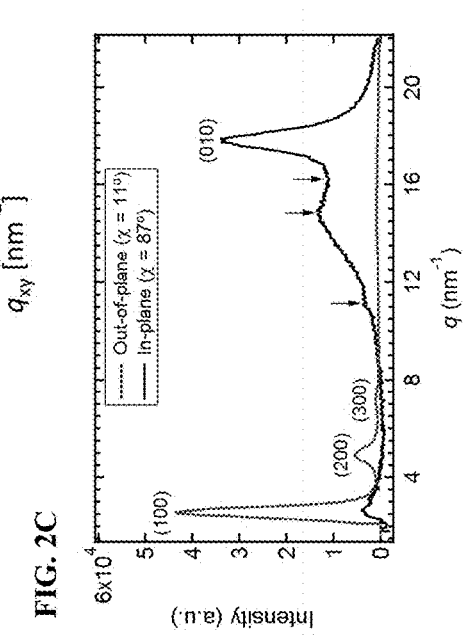

Unless otherwise defined, all terms of art, notations and other scientific terms or terminology used herein are intended to have the meanings commonly understood by those of skill in the art to which this invention pertains. Many of the techniques and procedures described or referenced herein are well understood and commonly employed using conventional methodology by those skilled in the art. In the description of illustrative embodiments, reference may be made to the accompanying drawings which form a part hereof, and in which is shown by way of illustration a specific embodiment in which the invention may be practiced. It is to be understood that other embodiments can be utilized and structural changes can be made without departing from the scope of the present invention.

The present invention is directed towards field-effect transistor devices in the context of organic electronics. See, e.g. Tseng, et al. "FIELD-EFFECT TRANSISTORS BASED ON MACROSCOPICALLY ORIENTED POLYMERS", U.S. patent application Ser. No. 14/426,487, which is incorporated herein by reference in its entirety. The invention disclosed herein relates to a blade coating method for generating highly aligned semiconductor polymer films on unidirectional nanogrooved substrates. Typical embodiments of the invention include method for modulating the charge carrier mobility of a field-effect transistor device. The method typically comprises generating uniaxial nanogrooves on a substrate and blade coating a solution comprising a semiconducting polymer onto the substrate. The nanogrooves induce alignment of the polymer chains on the substrate. In certain instances, the uniaxial nanogrooves are approximately 100 nm in width. The nanogrooves can be formed by "scratching" the substrate with a diamond lapping film, for example, containing 100 nm nanoparticles. The polymer solution is spread onto the substrate in a direction parallel to the nanogrooves and a main-chain axis of the polymer is parallel to the nanogrooves. In preferred embodiments of the invention, the method is performed so that polymers and fibers lie flat on the surface of the substrate. The cast semiconducting polymer is then annealed, so that a polymer film is formed on top of the substrate, a composition comprising polymer chains aligned parallel to the nanogrooves and a direction of charge carrier movement.

The presence of uniaxial nanogrooves and blade coating parallel to the nanogrooves is important for obtaining aligned films. The main-chain axis orientation relative to alignment direction strongly depends on the blade-coating conditions. In addition, faster coating rates (increasing speed and temperature) improves the alignment. Without nanogrooves, the driving forces for alignment are the solution shear force, the evaporation rate, and the solution flux (solvent and polymer aggregates) towards the film formation front. For the top-side of a film, the alignment improves with faster coating speeds due to a greater shear force. On the bottom-side, the shear force can be lower, and the interactions with the substrate effects the orientation as well. The presence of nanogrooves creates an additional driving force for alignment where the nanogrooves may serve as sites that induce orientation of the polymer chains. The fibers would ideally grow along the nanogrooves. Increasing coating speeds increases the shear force applied to the solution, thus helping align the polymer aggregates. Blade-coating parallel to the nanogroove direction is important for this alignment. With the flow parallel to the grooves, the polymer aggregates and grows along the nanogrooves. At higher evaporation rates (i.e. increasing coating temperature), the time span for the flux of the polymer aggregates towards film formation is reduced. As a result, the polymer aggregates have less time to move around in solution. The aggregates preferentially align near the nanogrooves. At slower coating speeds, the shear force is lower, thus limiting the orientation of the polymer aggregates. Plus, the slower evaporation rates increase the time the polymer aggregates move in solution. In this invention, the charge carrier mobility of a composition comprising polymers aligned according to the methods disclosed herein is greater than the charge carrier mobility of an identical composition of unaligned polymers.

The blade may comprise any hard surface, such as a glass slide. In illustrative embodiments, the blade used for blade coating the solution is positioned at least a 40°, 50° or 60° angle to the substrate and 150 μm above the substrate. In other embodiments, the polymer solution is blade coated onto the substrate at a rate of at least 0.4, 0.5 or 0.6 mm/s and at a temperature of at least 60, 70 or 80° C. In still other embodiments, the polymer film is annealed at a temperature of at least 200° C. In further embodiments, the annealed polymer film has a thickness between 20-40 nm (e.g. between 25-35 nm).

The extent of orientation in the aligned films can be quantified through order parameter calculations as described herein. Polarization-dependent near-edge X-ray absorption fine structure (NEXAFS) spectroscopy is a useful tool to probe the molecular orientation at the surface of conjugated polymer thin films.[26,27] NEXAFS is a soft X-ray technique where the photon energy can be tuned to probe π* or σ* orbitals of atoms like C, N, and S. One may use either the C K-edge or the N K-edge to determine the molecular orientation of polymer films. The polarized soft-X-ray is absorbed when the electric field vector (E) is in the direction of the transition dipole moment (TDM) of the 1 s to π* and 1 s to σ* orbitals of the atom in the molecule. The absorption process results in the excitation of an electron from the core shell to an anti-bonding orbital (1 s to π* or σ*). When the core hole fills, an X-ray photon (fluorescence) or an Auger electron is emitted. In general, the Auger electron is emitted from the top 2 nm surface of the film.[28] This surface sensitivity is useful as there is particular interest in the orientation near the interface of the nanogrooved substrate. In addition, the surface sensitivity is useful in terms of transistor physics as the charge transporting layer is within a 2-3 nm region near the semiconductor/dielectric interface.[29] The π-bonding character of the polymer chain is taken advantage of to probe the orientation of the film surface. The TDM of π* orbital is always orthogonal to the double-bond direction, thus orthogonal to the polymer backbone. As a result, the absorption probability depends on the relative orientation of the TDM of π* orbitals and E of the incident X-ray. In one specific embodiment, the polymer is PCDTPT, a donor-acceptor copolymer of a cyclopenta[2,1-b:3,4-b']dithiophene (CDT) donor unit and a [1,2,5]thiadiazolo[3,4-c]pyridine (PT) acceptor unit. PCDTPT contains both C=C and C=N bonds, thus both C is to π* transitions and N 1 s to π* transitions can be probed. The polarization dependence of the 1 s to π* resonance describes the preferential orientation of conjugated polymer backbone. Thus, order parameters can be calculated to quantify the extent of alignment for the blade coating films.

As described herein and in further detail in the Example section below as an illustrative embodiment, the molecular orientation of blade coated films of regioregular PCDTPT are characterized. Overall, blade coating on unidirectional substrates yields well-aligned films. Blade-coated films are semicrystalline and the crystallites orient primarily "edge-on." Generally, the characteristic lamellar alkyl side-chain spacing, $d_{100}$, is 2.51 nm and the π-π stacking distance, $d_{010}$, is 0.35 nm. The orientation of blade coating films can be further characterized using polarization-dependent PEY near-edge X-ray absorption fine structure (NEXAFS) spectroscopy at the C K-edge and N K-edge. As described in detail in the Example section below, theoretical calculations of the NEXAFS spectra for PCDTPT are disclosed herein to help predict and interpret experiential spectra. The C K-edge spectra consists of several π* resonance signals between 284 eV to 287 eV. Theoretical calculations of the C K-edge spectrum agrees with spectrum values obtained from illustrative experiments. In addition, the experimental N K-edge spectrum was in good agreement with the calculated NEXAFS spectrum. Using the calculated spectrum, peaks are generally assigned at 400 eV and 401.3 eV as π* transitions, while any peaks above are a mixture of π* and σ* transitions or only σ* transitions. Using the calculated spectrum, the σ* transition at 403.6 eV was determined to only correspond to the x-component of transition dipole moment (TDM). Theoretical calculation of NEXAFS spectra is a powerful tool to predict the absorption spectrum at various k-edges. One may use these calculations to predict the spectrum of newly synthesized molecules before running synchrotron experiments. Consequently, one can plan ahead for experiments and save valuable experimental synchrotron time.

Using the polarization dependence of the NEXAFS N 1 s to π* resonance signal in parallel and perpendicular configurations, the extent of molecular axis orientation relative to the alignment direction can be determined. In particular embodiments of the invention, the order parameters S and η are calculated using the N 1 s to π* transition at ~400 eV. S describes the extent of orientation of the polymer backbone tilt relative to the surface normal (i.e. "edge-on" or "face-on"), while η describes the extent of orientation of the main-chain axis of the polymer relative to the alignment direction. Typically, all films have uniaxial orientation out-of-plane where the conjugated polymer has a preferential "edge-on" orientation (S→−0.5). The presence of uniaxial nanogrooves is critical in obtaining in-plane alignment. Films on nanogrooves substrates generally have the best alignment as indicated by the large positive η values obtained in illustrative experiments. Furthermore, the in-plane alignment is greatest on the bottom-side of films. In certain embodiments of the invention, the best alignment occurs at a more rapid blade coating rate of 0.6 mm/s and T=80° C.(η=0.96 and S=−0.35). The blade coating method on nanogrooved substrates are applicable to the vast majority of conjugated polymers in order to yield highly aligned films.

Typically, the polymer crystallizes to form a fiber having a long-axis and a short-axis, and the main-chain axis of the polymer is parallel to the long-axis of the fiber while π-π stacking is in a direction along the short-axis of the fiber. The polymer backbone/main-chain axis adopts a preferential edge-on orientation for all blade coating conditions (perfectly edge-on case being when $f_z=0$ and S=−0.5). In certain embodiments of the invention, a tilt, S, of the polymer main-chain axis relative to a normal of the substrate is less than or equal to −0.35 and an orientation, η, of the polymer main-chain axis relative to the alignment direction is greater than or equal to 0.96.

EXAMPLE

Example 1

Methods and Materials

Materials. Regioregular PCDTPT (FIG. 1A) was synthesized using a previously reported method.[25] The PCDTPT used in this study has a number average molecular weight of ($M_n$) of 50 kg/mol and a polydispersity index (PDI) of 3.0 as determined using the refractive index detector of gel permeation chromatography (GPC) with chloroform as the eluent solvent (polystyrene calibration). Anhydrous chlorobenzene and anhydrous toluene was purchased from Sigma-Aldrich™. n-Decyltrichlorosilane (DTS) was purchased from Gelest™.

Substrate Preparation. GIWAXS and NEXAFS samples were prepared on highly p-doped silicon wafer with a 300 nm thermal oxide layer (University Wafer). To form uniaxial nano-grooves, the substrates were "scratched" with a diamond lapping film containing 100 nm nanoparticles. The substrates were sonicated in acetone and isopropanol and then exposed to UVO for 15 minutes. The $SiO_2$ surface was passivated by immersing the substrates in a DTS and anhydrous toluene solution (0.10 to 1 volume ratio) for 20 minutes and subsequently rinsed with toluene.

Blade Coating. Films were fabricated using a custom-built blade coating system housed in a N2-filled glovebox. A glass slide was used as the blade, which was cleaned by sonication in acetone, isopropanol, and subsequently was exposed to UVO for 30 minutes. The prepared substrate was placed on a temperature controlled stage. The glass slide was placed in the blade coating system and placed at a 60° angle relative to the substrate using a manual rotational stage (refer to FIG. 1B). Next, the blade was lowered using a manual vertical-linear stage (equipped with a digital micrometer) until the blade made contact with the substrate. The micrometer was zeroed and then raised until a gap height of approximately 0.15 mm was reached. Then, approximately 8-10 μL of polymer solution was placed between the blade and substrate. The motorized translation stage was activated and allowed to travel at a desired speed for the total length of the substrate. The films are annealed at 200° C. following previous methods.[22] A coarse optimization of the blade coating method ranging between slow and fast coating rates was implemented. Solutions of PCDTPT in chlorobenzene were coated at three blade coating rates: 0.03 mm/s at 28° C., 0.30 mm/s at 50° C., and 0.6 mm/s at 80° C. At these coating speeds and temperatures, the film formation edge (evaporation zone) was located near the edge of the blade. In addition, the elevation in coating temperature was needed at faster speeds due to the high boiling point of chlorobenzene and hydrophobicity of the substrate (DTS passivation). The resulting films have a thickness between 25-35 nm.

Grazing Incidence Wide-Angle X-ray Scattering (GI-WAXS). 2D GIWAXS images were obtained using beamline 11-3 synchrotron radiation. The samples were exposed to X-rays with a wavelength of 0.9752 Å and 2D scattering images were obtained using a MAR345 image plate detector, which was placed 400 mm from the sample. A $LaB_6$ sample was used a standard calibrant. All samples were placed in a He-filled chamber to reduce air scattering. The reported GIWAXS images were taken at a grazing incident X-ray angle ($\alpha$) of 0.10.

Example 2

Determining Degree of Alignment of Blade-Coated PCDTPT Films

There is specific interest in studying the degree of alignment of blade coated PCDTPT films. Polarization-dependent near-edge X-ray absorption fine structure (NEXAFS) spectroscopy is a useful tool to probe the molecular orientation at the surface of conjugated polymer thin films.[26,27] NEXAFS is a soft X-ray technique where the photon energy can be tuned to probe $\pi^*$ or $\sigma^*$ orbitals of atoms like C, N, and S. The polarized soft-X-ray is absorbed when the electric field vector (E) is in the direction of the transition dipole moment (TDM) of the 1 s to $\sigma^*$ and 1 s to $\sigma^*$ orbitals of the atom in the molecule. The absorption process results in the excitation of an electron from the core shell to an anti-bonding orbital (1 s to $\pi^*$ or $\sigma^*$). When the core hole fills, an X-ray photon (fluorescence) or an Auger electron is emitted. In general, the Auger electron is emitted from the top 2 nm surface of the film.[28] This surface sensitivity is useful as there is particular interest in the orientation near the interface of the nanogrooved substrate. In addition, the surface sensitivity is useful in terms of transistor physics as the charge transporting layer is within a 2-3 nm region near the semiconductor/dielectric interface.[29] The $\pi$-bonding character of the polymer chain is taken advantage of to probe the orientation of the film surface. The TDM of $\pi^*$ orbital is always orthogonal to the double-bond direction, thus orthogonal to the polymer backbone. As a result, the absorption probability depends on the relative orientation of the TDM of $\pi^*$ orbitals and E of the incident X-ray. PCDTPT contains both C=C and C=N bonds, thus both C 1 s to $\pi^*$ transitions and N 1 s to $\pi^*$ transitions can be probed. The polarization dependence of the 1 s to $\pi^*$ resonance describes the preferential orientation of conjugated polymer backbone. Thus, order parameters can be calculated to quantify the extent of alignment for the blade coating films.

In this example, the first reported C and N k-edge NEXAFS spectra for a CDT-PT based copolymer is presented. In addition, theoretical calculations of the NEXAFS spectra for PCDTPT are presented in order to help predict and interpret experiential spectra.[30] Films are blade-coated on substrates with and without nanogrooves at three varying rates. Using polarization-dependent NEXAFS data, the order parameters, S and η, are calculated for all blade coating conditions. S describes the orientation of the polymer backbone tilt relative to the surface normal (i.e. "edge-on" or "face-on"), while $f$ describes the extent of orientation of the main-chain axis of the polymer relative to the alignment direction. Specifically, the polarization dependence of the N 1 s to $\pi^*$ resonance is used to calculate the order parameters. This is the first report on the use of N k-edge to study the molecular orientation of aligned conjugated polymers.

Theoretical Calculations of NEXAFS Spectra. Theoretical NEXAFS spectra were calculated through an excited state core-hole (XCH) computational method based on constrained-occupancy DFT (Density Functional Theory). This computational method was developed by Prendergast et al. at The Molecular Foundry on the Lawrence Berkeley National Lab (LBNL) campus.[30] Calculations were submitted on a web-based portal system (http://portal.nersc.gov/) using the computing resources of the National Energy Research Scientific Computing Center (NERSC) at LBNL.

Polarization-dependent NEXAFS Spectroscopy. NEXAFS experiments were performed on a U7A NIST/Dow end station. The X-ray beam was elliptically polarized (polarization factor, $P=0.85$) with the electric field vector dominantly in the plane of storage ring. The magic angle is ~51° at P=0.85 (magic angle ~54.7° for P=1). The beamline has an incident photon energy flux of about $1 \times 10^{11}$ photons/s at a storage ring current 500 mA. A spherical grating monochromator was used to obtain monochromatic soft X-rays at an energy resolution of 0.2 eV. The sample stage was attached to a computer-controlled goniometer, which sets the orientation of the sample with respect to the polarized X-rays. The partial electron yield (PEY) is collected using a channeltron electron multiplier with an adjustable entrance grid bias voltage, which was set to −150 V for this study. The spot diameter of the X-ray beam is about 0.1 mm at the θ=90°. C and N K-edge NEXAS spectra were acquired for incident photon energy from 270 eV to 440 eV. The C K-edge PEY NEXAFS spectra were normalized by dividing the PEY intensity by the incident beam intensity ($I_0$). Then, the linear pre-edge (270-280 eV) was subtracted from the normalized spectra. Lastly, the post-edge intensity at 320 eV of the spectra was normalized to unity. For the N K-edge, the spectra were first normalized using the C K-edge procedure. Then, the background signal arising from the C atoms in the region between 390 and 430 eV was subtracted using an exponential fit (FIG. 13).

Films for NEXAFS experiments were fabricated using the substrate preparation and blade coating method described above. The NEXAFS spectra were obtained for both top-side (surface) and the bottom-side of the film. To perform NEXAFS experiments on the bottom-side of the film, pressure-sensitive adhesive was used to delaminate the film from the substrate. A NEXAFS measurements was taken of a substrate after the delamination. As shown in FIG. 9, the C k-edge spectrum consists of no $\pi^*$ resonance signals and no reasonable signal in the N k-edge, which indicates the film was fully removed from the substrate.

As shown in FIG. 1B, θ is angle between the sample surface and incident soft-X ray. The electric field vector (E) is orthogonal to the incident soft X-ray, thus θ is also the angle between the incident soft X-ray and the surface normal. The C k-edge spectra were obtained at θ values ranging from 20° to 90° and N k-edge spectra were obtained at θ=30°, 51°, and 80°. The samples were measured in two configurations in order to study the molecular orientation of the aligned films as shown in FIG. 1B. In the perpendicular configuration, the sample is first placed where E is perpendicular to the alignment direction at normal incidence and then rotated about the x-axis (alignment axis) to obtain the angular dependence. Then, the sample is rotated 90° about the z-axis to obtain the parallel configuration where E is parallel to the alignment direction at normal incidence. The sample is rotated about the y-axis to obtain the angular dependence for the parallel configuration.

Results and Discussion

Figure 10:
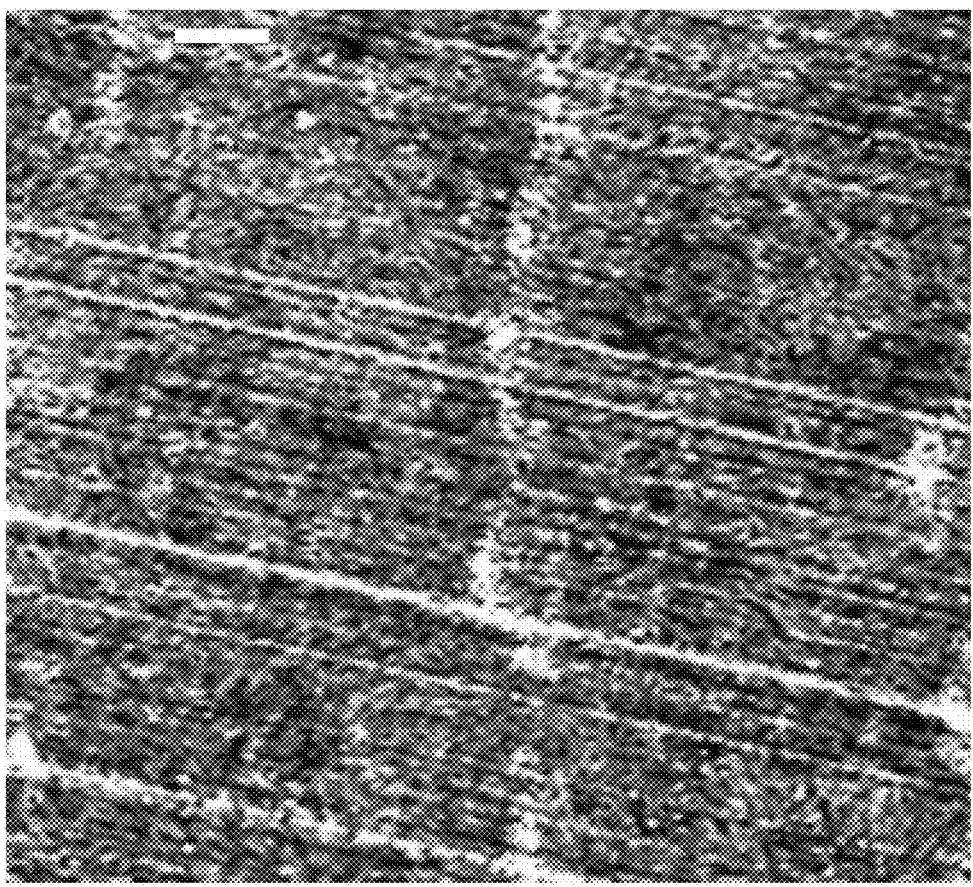
FIG. 10 illustrates an AFM height image of bottom-side of film from blade coating on nanogrooved substrates (0.3 mm/s), in accordance with one or more embodiments of the invention. Scale bar=100 nm.
Figure 11:
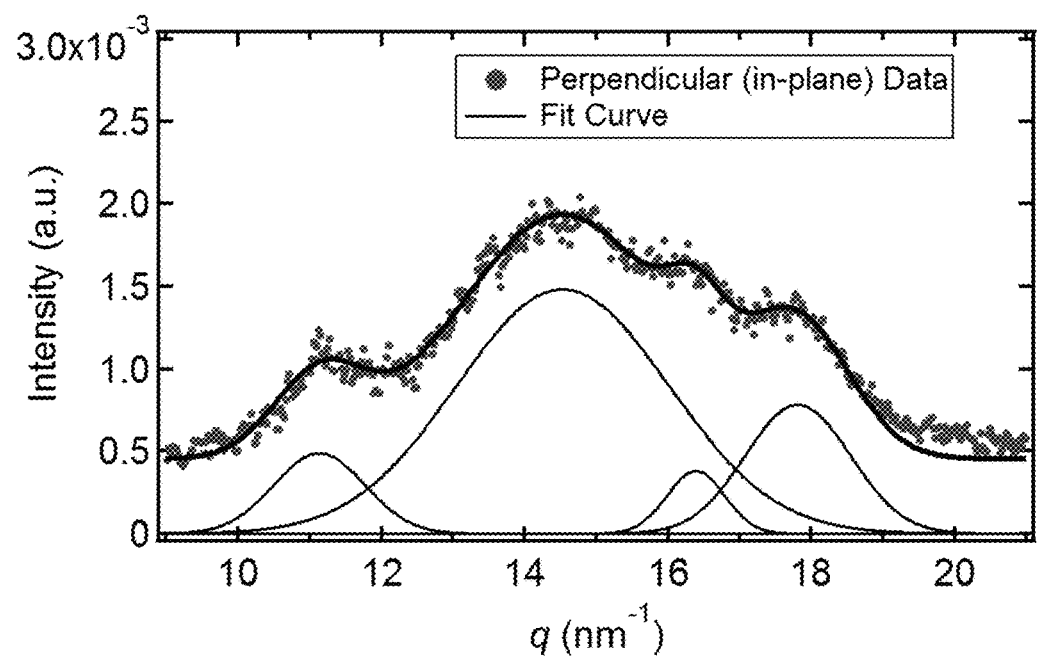
FIG. 11 illustrates a peak fitting of in-plane line cut at high q, in accordance with one or more embodiments of the invention. The peak at q~17.8 nm$^{-1}$ corresponds to the (010) reflection for $\pi$-$\pi$ stacking. The broad peak q~14.5 nm$^{-1}$ is combination of scattering from the substrate (amorphous SiO$_2$) and the amorphous phase of the polymer film. The ratio between the peaks at q~11.1 nm$^{-1}$ and at q~16.4 nm$^{-1}$ is about 1.5. This might indicate that these correspond to (002) and (003) reflections.

Probing Crystalline Structure and Orientation using GIWAXS. According to previous studies, regioregular PCDTPT thin films are semicrystalline.[23,31] PCDTPT crystallizes to form fiber bundle structures where the main-chain axis is parallel to the fiber direction.[23] Blade-coated films form these fiber bundle structures as well as seen in AFM height image in FIG. 10. This image is from the bottom-side of a film that was coated on a uniaxial nano-grooved substrate. It can be seen that the fibers tend to align parallel to the nano-grooves similar to the sandwich casting method described earlier. Furthermore, Grazing Incidence Wide Angle X-ray Scattering (GI-WAXS) experiments were performed on a blade coated film to assess the crystallite structure and orientation. The samples for GIWAXS experiments were orientated to where the incident X-ray was parallel and perpendicular to the alignment direction. In FIG. 2, representative GIWAXS images are shown for a film blade-coated at 0.3 mm/s on a nano-grooved substrate. Line cuts were taken for both out-of-plane (polar angle, χ, of 11°) and in-plane scattering directions (χ=88). The scattering profiles show that the lamellar alkyl stacking reflections (h00) are primarily out-of-plane and the π-π stacking reflection is (010) primarily in-plane (FIG. 2c). Therefore, the crystallites adopt a preferential "edge-on" orientation. The (100) reflection at q~2.51 nm$^{-1}$ indicates that the characteristic lamellar packing distance, $d_{100}$, is ~2.50 nm. The (010) reflection at q~17.7 nm$^{-1}$ indicates that the characteristic π-π packing distance, $d_{010}$, is ~0.36 nm. In addition, the higher intensity of the (010) peak for the parallel configuration relative to the perpendicular configuration indicates preferential in-plane alignment of the crystallites relative to the nanogroove direction (FIG. 2D). It is important to note the difference of the in-plane scattering intensity of the (010) reflections are used only for qualitative confirmation that blade coating yields aligned films. The issue arises from the fact that the sample orientation and incident X-ray angle are fixed in a GIWAXS experiment. Therefore, the scattering of a parallel planes are not entirely accurate, especially in the high q range of the (010) reflection. Ideally, in-plane high-resolution point-detector measurements are performed where the sample can be rotated to meet the Bragg conditions.[26]

Experimental and Theoretical NEXAFS Spectra of PCDTPT. In FIG. 3, representative experimental C K-edge and N K-edge PEY NEXAFS spectra for the top-surface of a film are shown. This film was blade-coated along the uniaxial nanogrooves (0.3 mm/s, T=50° C.). The peaks in the spectra arise from the energy required to excite a 1 s core electron to an unoccupied molecular orbital. C K-edge NEXAXS spectrum in FIG. 3B shows several C 1 s to π* peaks in the range of 284 ev to 286.7 eV, which arise from the C=C and C=N bonds of the polymer. The presence of several distinct C 1 s to π* peaks are not typically observed in P3HT or PBTTT, but have been observed in various PPV derivatives[32] and donor-acceptor polymers such as P(NDIOD-T2)[17] and F8BT[32]. The absorption structure at 287.6 eV results from the C 1 s to σ* transitions due to C—S and C—H bonds. In addition, the broad structures centered around 293.2 eV and 305 eV are due to the C 1 s to σ* transitions of the C—C bonds of the backbone and side-chains, respectively. To the best of our knowledge, this is the first report on the N K-edge spectrum of PCDTPT (FIG. 3C), more specifically, a donor-acceptor polymer containing a PT unit. It can be reasonably assumed that the broad absorption structures at ~410 eV and ~420 eV are N 1 s to σ* transitions. As reported for BT (benzothiadiazole) containing polymers, the first peak corresponds to N 1 s to π* transition.[33] Thus, the first peak ~400 eV is a π* transition, which arises from the C=N bonds in the PT unit. For the case of BT-containing polymer, it was suggested additional N 1 s to π* transitions occur below the onset of N 1 s absorption (~405 eV).[33,34] As a result, the peaks at 401.3 eV, 402.7 eV, and 403.8 eV could be N 1 s to π* transitions as well.

Theoretical calculations of NEXAFS spectra can further help elucidate the assignment of the π* transitions observed experimentally. In FIG. 3A, the DFT-optimized geometry of an A-D-A-D repeat unit of PCDTPT is shown, which was used to calculate the theoretical NEXAFS spectra. FIG. 3B compares the calculated C K-edge spectrum with the experimental spectrum between the E range of 283 eV and 287 eV. The calculated and experimental spectra are in very good agreement with respect to the observed C 1 s to π* transitions. The calculated spectrum for each unique C of the CDT-PT unit can be further de-convoluted to determine if the excitation of a specific carbon corresponds to a particular π* resonance signal. As shown in FIG. 12, this analysis is non-trivial and the excitation of the unique carbons contribute to all of the observed 1 s to π* transitions. The lowest π* transition at 284.6 eV is observed to be primarily from carbon D5 in the CDT unit. The highest π* transition near 286.5 eV are from carbons A2 and A3 of the PT and carbons D3 and D4 in the CDT.

FIG. 3C compares the calculated N K-edge spectrum with the experimental spectrum between the E range of 397 eV and 406 eV. The calculated and experimental spectra are in good agreement. A red-shift of 1.25 eV was applied to the calculated spectrum so that first π* resonance signal matched the experimental value (~400 eV). Because only the excitation of three nitrogen atoms are looked at, the de-convolution analysis is greatly simplified with respect to the carbon calculations. The calculated NEXAFS spectra for each N atom are shown in FIG. 13. The calculated NEXAFS spectra can be further de-convoluted into the x, y, and z components of the TDM vector as shown in FIG. 14. The z-component corresponds to the polarization orthogonal to the conjugated plane; hence, in the direction of the π* TDM. Therefore, the z-component of the calculated NEXAFS corresponds to the N 1 s to π* transitions. The first peak at ~400 eV corresponds to a π* resonance. The excitation of the pyridyl nitrogen (N1) and the nitrogen atoms of the thiadazole unit (N2 and N3) all contribute to the first π* resonance at ~400 eV. The NEXAFS signals are similar for N2 and N3, but the signal from N1 is slightly lower by 0.35 eV. When N1 is excited, the LUMO is delocalized between both donor and acceptor units. In contrast, when N2 and N3 are excited the LUMO is primarily localized around the acceptor unit (PT). For BT-containing copolymers, which consist of same N atoms as N2 and N3 of the PT unit, Gliboff et al. observed similar localization of the LUMO around the acceptor unit. The LUMO from the excitation of N1 could be more delocalized because the corresponding C═N bond is in conjugation with the CDT unit. A strong second π* transition occurs at ~400.8 eV. Interestingly, this transition is only from the excitation of N1. Additional higher order π* transition occur at 401 eV and 402.5 eV primarily from N2 and N3. However, these signals are mixed in with a strong σ* transition peak according to x and y components of the NEXAF spectra. Therefore, any signal past 401.5 eV start to include σ* character. Interestingly, as shown in FIG. 14, the calculated peak at ~403.6 eV is primarily from the x-component of the TDM, which is parallel to the molecular axis. Furthermore, this transition occurs from the excitation of two thiadiazole nitrogen atoms (N2 and N3). Therefore, the transition at ~403.6 eV provides an alternative route to study the orientation of the polymer chains. It is postulated that the electronic dipole moment of the lone-pair electrons on N2 and N3, which are primarily oriented parallel to the x-axis, influence the transitions observed at 403.6 eV. A small peak at 402.5 eV is also observed for N1, which is primarily from the y-component. For the excited N1 atom, the lone-pair electrons are oriented more along the y-axis, thus potentially influencing the anisotropy of the TDM. Returning to the experimental NEXAFS spectrum, it can be concluded that the large peak at 400 eV and the small peak at 401.3 eV are π* transitions. The peaks at 402.7 eV and ~403.8 eV are σ* transitions while the latter TMD is primarily along the molecular axis.

Figure 4:
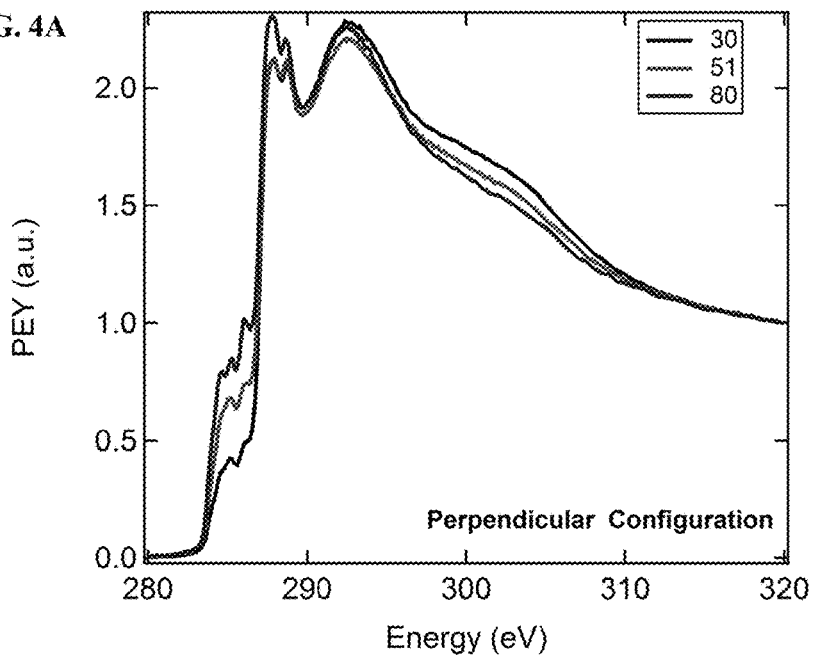
FIG. 4 illustrates the C k-edge PEY data for the bottom-side of a film blade coated on a nanogrooved substrates at 0.3 mm/s, in accordance with one or more embodiments of the invention. Scans were taken at $\theta$=30, 51, 80 in the (FIG. 4A) perpendicular and (FIG. 4B) parallel configurations.
Figure 4:
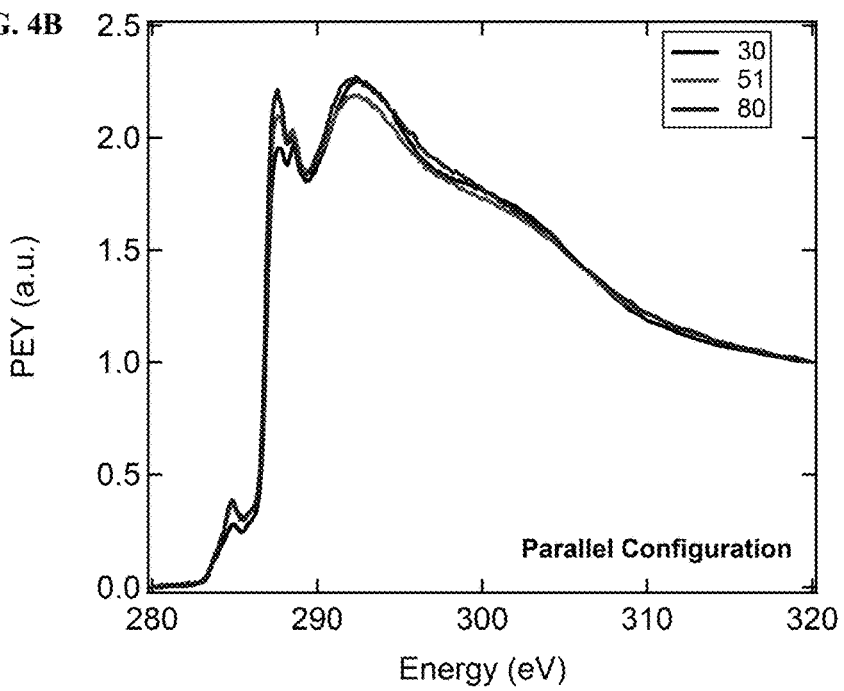

Qualitative Discussion of NEXAFS Results for Probing Orientation. FIG. 4 shows the C K-edge polarization dependent NEXAFS signal for a bottom-side film taken in the perpendicular and parallel configurations. This film was blade-coated along the uniaxial nanogrooves (0.3 mm/s, T=50° C.). As seen in FIG. 4, the difference in intensity of the C 1 s to π* resonances (at 285.2, 285.7 and 286.7 eV) from θ=30° to 80° corresponds to a clear indication of polarization anisotropy. In the perpendicular configuration, the sample is rotated about the alignment axis (x-axis) relative to electric field vector (E) of the incident X-ray. Absorption occurs when the π* TDM is parallel to E. Therefore, the increase in intensity of the π* resonance from θ=30° to 80° qualitatively indicates that the aromatic rings tend to adopt a more edge-on orientation about the molecular chain axis. This orientation means the sample is rotated about main-chain axis of the polymer.

In the parallel configuration, the sample is rotated about the axis orthogonal (y-axis) to the alignment direction relative to the E of the incident X-ray. Therefore, the polarization dependent NEXAFS signal for the parallel configuration describes the orientation of the main-chain axis (molecular axis) relative to the alignment direction. As shown in FIG. 4B, the parallel configuration NEXAFS signal does not show any significant polarization anisotropy and is lower in intensity with respect to the perpendicular configuration. It is important to note that a C 1 s to π* absorption signal 285.5 eV and an σ* absorption structure at ~289 eV that are from the acrylate-based adhesive was observed, which is underneath the conjugated polymer film (FIG. 9A). Signals from the adhesive may have been gotten either from pin-holes in the film or diffusion of acrylate monomer into the conjugated polymer film. The π* resonance at 285.5 eV is most clearly seen in the parallel configuration sample as the π* resonance signals are weakest from the conjugated polymer. As a result, the π* resonance signals from the adhesive and conjugated polymer are blended together and indistinguishable near 285.5 eV. However, the C 1 s to π* signal at 286.6 eV does not completely overlap with π* resonance from the adhesive. Therefore, the π* resonance at 286.7 eV can be qualitatively used to describe the polarization dependence. At θ=80°, alignment direction is nearly parallel to the E of the incident X-ray. The intensity of the π* resonances is expected to be low due to the E vector being orthogonal to the π* TDM. In addition, it is known from the perpendicular configuration that the aromatic rings tend to adapt a more edge-on orientation. Therefore, the intensity of the π* resonance at θ=30° would be expected to be low as well, which is what was observed from the NEXAFS data. The lack of any significant polarization anisotropy and low intensity indicates preferential orientation of the main-chain axis along the alignment direction.

Figure 5:
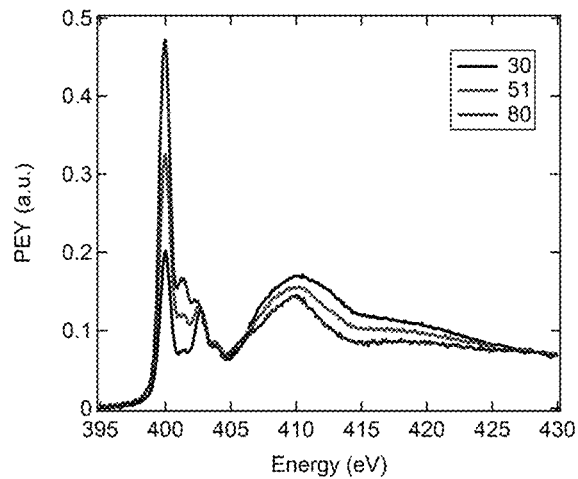
FIG. 5 illustrates the N k-edge PEY data for the bottom-side of a film blade coated on a nanogrooved substrates at 0.3 mm/s, in accordance with one or more embodiments of the invention. Scans were taken at $\theta$=30, 51, 80 in the (FIG. 5A) perpendicular and (FIG. 5B) parallel configurations.
Figure 5:
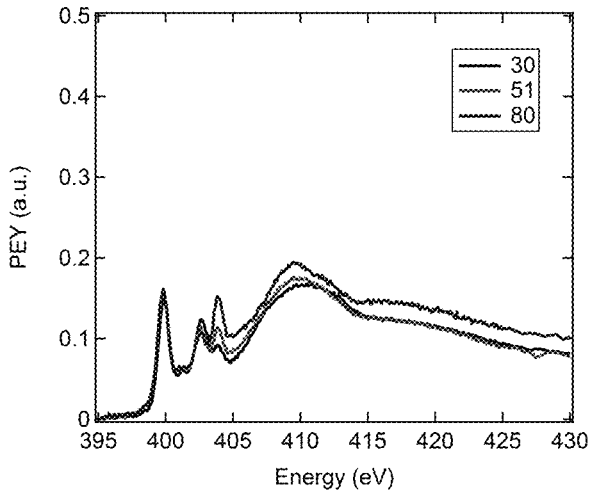
Figure 5:
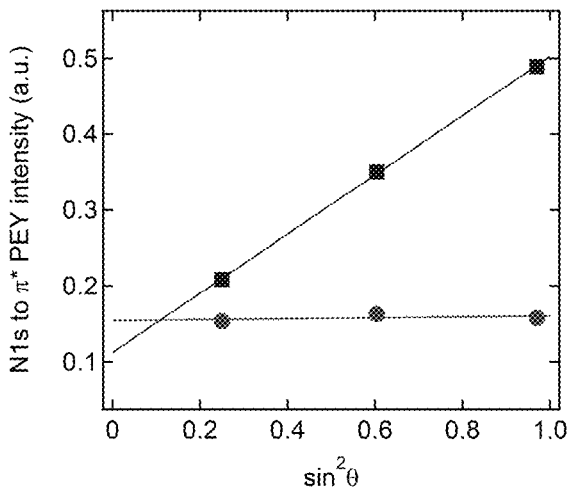

In addition, the N K-edge polarization dependent NEXAFS results can be used to describe the orientation in the film (FIG. 5). Importantly, no significant absorption signals from the tape in the N K-edge were observed (see FIG. 9D). This is particularly useful for samples measured on the bottom-side of the film where the adhesive C 1 s to π* resonance signal overlaps with the C 1 s to π* resonance signals from PCDTPT. FIG. 5 shows the N K-edge polarization dependent NEXAFS signal for a bottom-side film taken in the perpendicular configuration and parallel configuration. As seen with the C K-edge, the intensity of the N 1 s to π* resonances (at 400 eV and 401 eV) increases from θ=30° to 80°. This trend confirms that the aromatic rings tend to adopt a more edge-on orientation about the molecular chain axis. With respect to the parallel configuration, N K-edge NEXAFS signal indicates a low intensity N 1 s to π* resonance signals and no significant polarization anisotropy. This trend confirms C K-edge data that the main-chain axis is preferentially orientated along the alignment direction. The qualitative agreement between the C K-edge and N K-edge data is not surprising as the 1 s to π* TDMs are orthogonal to the main-chain axis for both C═C and C═N bonds and there is no torsion angle between the CDT and PT units. It will be confirmed later that the order parameters calculated using the π* resonance from the C or N K-edge are equivalent. As discussed earlier, the peak at ~403.8 eV relates to the σ* TDM primarily along the molecular axis. Comparing the intensity of ~403.8 eV peak at θ=80° between the parallel and perpendicular configuration, the intensity is greater in the parallel configuration. This difference indicates the main-axis is oriented preferentially along the alignment direction, which is in agreement from analysis using the π* resonances. In addition, the polarization anisotropy of the 403.8 eV peak experimentally confirms that the TDM is along the molecular axis. The ability to tune the photon energy to specific value corresponding to a σ* TDM along the molecular axis is potentially a powerful tool. In general, polarized soft X-ray absorption experiments do not accurately capture the alignment of chains where the conjugated plane is parallel to plane of the film ("face-on"). If there was a film that was predominately "face-on" and with in-plane alignment, the polarization-dependent NEXAFS intensity of the π* transitions would be nearly equivalent in the parallel and perpendicular configurations. Thus, the results would incorrectly indicate an isotropic film. However, probing the σ* TDM along the molecular axis would capture the extent alignment in the film, which are missed by looking at the π* transitions.

Calculation of Biaxial Order Parameters. Using the polarization dependence of the NEXAFS 1 s to π* resonance signal in the parallel and perpendicular configurations, the extent of molecular axis orientation relative to the alignment direction can be determined.

The quantification of the orientation follows the method employed by Stohr and co-workers.[35] Previous work by Pattison et al.[36] adopted the method of Stohr and co-workers to calculate the extent of alignment of poly(9,9-dioctylfluorene-co-bithiophene) thin films on rubbed polyimide substrates.

Three TDM orientation factors $f_x$, $f_y$, and $f_z$, are defined to describe the relative alignment of the TDM of the π*-orbital along three orthogonal axes: x (alignment direction), y (in-plane perpendicular to alignment direction), and z (normal to the surface). In other words, the three orientation factors are projections of the π* TDM on the x, y, and z axes, thus the fraction of the TDM of the molecules along three x, y, and z axes. The three TDM orientation factors can be determined from the fit coefficients of a linear relationship describing the polarization dependent (i.e. angular dependent) is to π* resonance intensity (I), $$I(\theta) = A + B \sin^2(\theta), \quad (1)$$

where A and B are fit coefficients. Equation 1 is applied to the parallel configuration and perpendicular configuration to define $I^{\|}(\theta)$, $I^{\perp}(\theta)$, $A^{\|}$, $A^{\perp}$, $B^{\|}$ and $B^{\perp}$. Using these fits coefficients, the three TDM orientation factors can be calculated using the following equations:

$$f_x = \frac{A^{\perp} + B^{\|}}{I_{tot}}, \quad (2a)$$

$$f_y = \frac{A^{\|} + B^{\perp}}{I_{tot}}, \quad (2b)$$

$$f_z = \frac{A^{\perp} + B^{\|}\left(1 - \frac{1}{P}\right)}{I_{tot}}, \quad (2c)$$

where P is the polarization factor (0.85) and $I_{tot}$ is the total integrated intensity. Storh et al. used an additional term for the surface tilt angle, γ, which is assumed equal to zero for the polymeric material. Using the normalization condition $f_x + f_y + f_z = 1$ yields the following expression:

$$I_{tot} = \frac{3}{2}(A^{\|} + A^{\perp}) + \frac{3P-1}{2P}(B^{\|} + B^{\perp}). \quad (3)$$

Using the TDM orientation factors, $f_x$, $f_y$, and $f_z$, two order parameters: (1) S, the uniaxial order parameter, which describes the orientation of the plane of the polymer backbone relative to the z-axis (i.e. orientation of the π* TDM relative to surface normal) and (2) η, the biaxiality parameter, which describes the orientation of the main-chain axis relative to the alignment direction, can be calculated. $f_z = \cos^2 \alpha$ where α is the angle between the TDM and z-axis. Using the second Legendre polynomial expression for the structural order parameter, $S = \frac{1}{2}(3\langle\cos^2\alpha\rangle - 1)$, the following equation is obtained for the uniaxial order parameter in terms of $f_z$:

$$S = \frac{1}{2}(3f_z - 1). \quad (4)$$

In addition, the biaxiality parameter, which gives the orientation of the π* orbitals in the x-y plane, is defined to be the following:

$$\eta = 3/2(f_y - f_x). \quad (5)$$

When S=0 and η=0, π* TDMs are randomly orientated about the molecular axes (S=0) and the main-chain axes are randomly orientated along all three axes and the (η=0). When S=1, the π* TDMs are perfectly orientated along z-axis, which means the conjugated segments of the molecule are perfectly face-on relative to the surface. When S=−0.5, the π* TDMs are orthogonal to the z-axis, which means the conjugated segments of the molecule are perfectly edge-on and all π* TDMs are in the x-y plane. When S is large and negative, η>0 corresponds to a preference of the main-chain axes to orient along the alignment direction ($f_y > f_x$), while η<0 corresponds to a preference of the main-chain axes to orient orthogonal to the alignment direction ($f_x > f_y$). For the case of S=−0.5 ($f_z = 0$), η=1.5 for perfect alignment, η=0 for no alignment, and η=−1.5 for orthogonal alignment.

Figure 16:
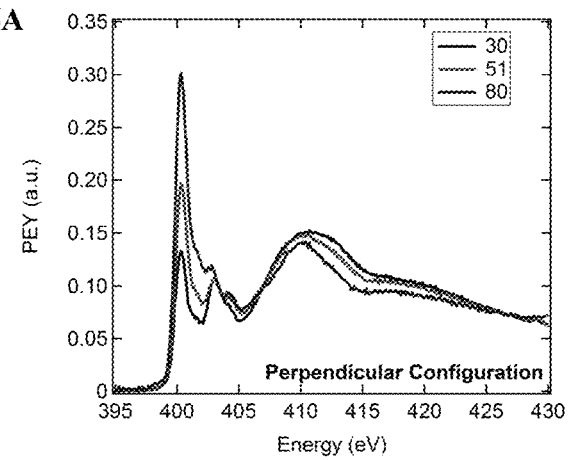
FIG. 16 illustrates N k-edge PEY data for the top-side of a film blade coated on a nanogrooved substrates at 0.3 mm/s, in accordance with one or more embodiments of the invention. Scans were taken at $\theta$=30, 51, 80 in the (FIG. 16A)
Figure 16:
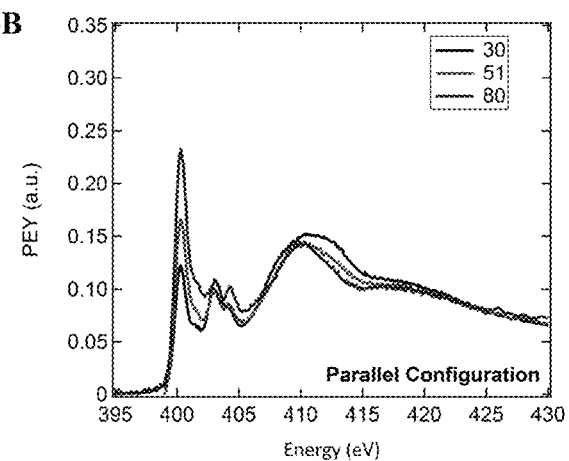
Figure 16:
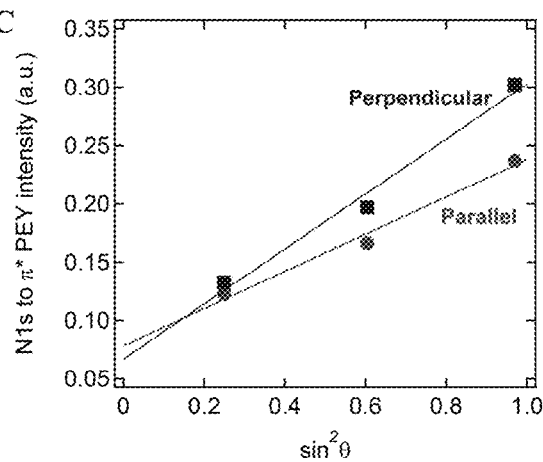

Biaxial Order Parameters from either C or N K-edges. As discussed earlier, the order parameters can be calculated using either the C 1 s to π* transitions or N 1 s to π* transitions. When using the C 1 s to π* transition at 285.2 eV, S=−0.40 and η=0.23 (FIG. 15) for films blade coated at 0.3 mm/s. When using the N 1 s to π* transition at 400 eV, S=−0.37 and η=0.21 (FIG. 16). The S and η values are quite similar when using either the C K-edge or N K-edge. As qualitatively observed earlier, the similarity is not surprising as the 1 s to π* TDMs are orthogonal to the main-chain axis for both C=C and C=N bonds. Therefore, one may use either the C K-edge or the N K-edge to determine the molecular orientation of PCDTPT films. Due to some complications from the adhesive in the C K-edge (see Example 1), the N K-edge polarization dependent NEXAFS data was used to calculate the order parameters in order to study the orientation in the various blade coated films.

Overview of Biaxial Order Parameters. In Table 1, the values of $f_x$, $f_y$, $f_z$, S, and η are presented for the top- and bottom-side of films blade coated on substrates with and without uniaxial nano-grooves. As shown in Table 1, $f_z$ and S do not vary significantly for all blade coating conditions. The values of $f_z$ ranges from 0.07 to 0.17, which correspond to S values of −0.395 to −0.245. These values indicate the polymer backbone adopts a preferential edge-on orientation for all blade coating conditions (perfectly edge-on case being when $f_z = 0$ and S=−0.5). On the other hand, we observe significant variation in $f_x$, $f_y$, and η. In particular, $f_x$ ranges from 0.12 to 0.55, which indicates the main-chain axis orientation relative to alignment direction strongly depends on the blade-coating conditions. When the main-chain axis is perfectly orientated along the alignment direction, the value of $f_x = 0$. When $f_z$ is small, as is the case for all our films, η should be large and positive ($f_y > f_x$) for highly aligned films (upper limit being η=1.5 when $f_x = 0$ and $f_z = 0$ according to equation 5). η≈0 indicates no alignment while η<0 indicates preference for main-chain axis to orient perpendicular to the alignment direction. The polymer chains are assumed to lie in the plane of the film (x-y plane). Therefore, when the aromatic backbone is randomly orientated about the main-chain axis, which is also randomly orientated relative to the alignment direction, $f_x = f_y = 0.25$ and $f_z = 0.5$. The values are S and η are 0.2 and 0, respectively. However, this case was not observed in any of our films as indicated by the values in Table 1. Some cases were observed where η≈0, but all the films have some degree of orientation out-of-plane (uniaxial orientation relative to surface normal).

TABLE 1

TDM Orientation factors (fx, fy, and fz), order parameters S and η for blade coated films

| Blade Coating Condition | Top or Bottom | Nano Grooves? | $f_x$ | $f_y$ | $f_z$ | S | η |
|---|---|---|---|---|---|---|---|
| 0.03 mm/s T = 28° C. | Top | No | 0.55 | 0.33 | 0.12 | −0.32 | −0.33 |
| | | Yes | 0.31 | 0.56 | 0.15 | −0.275 | 0.375 |
| | Bottom | No | 0.41 | 0.52 | 0.07 | −0.395 | 0.165 |
| | | Yes | 0.26 | 0.58 | 0.17 | −0.245 | 0.48 |
| 0.3 mm/s T = 50° C. | Top | No | 0.47 | 0.44 | 0.09 | −0.365 | −0.045 |
| | | Yes | 0.39 | 0.54 | 0.07 | −0.395 | 0.225 |
| | Bottom | No | 0.43 | 0.48 | 0.09 | −0.365 | 0.075 |
| | | Yes | 0.16 | 0.72 | 0.15 | −0.275 | 0.84 |
| 0.6 mm/s T = 80° C. | Top | No | 0.31 | 0.60 | 0.12 | −0.32 | 0.435 |
| | | Yes | 0.23 | 0.66 | 0.14 | −0.29 | 0.645 |
| | Bottom | No | 0.31 | 0.61 | 0.09 | −0.365 | 0.45 |
| | | Yes | 0.12 | 0.76 | 0.10 | −0.35 | 0.96 |

Figure 6:
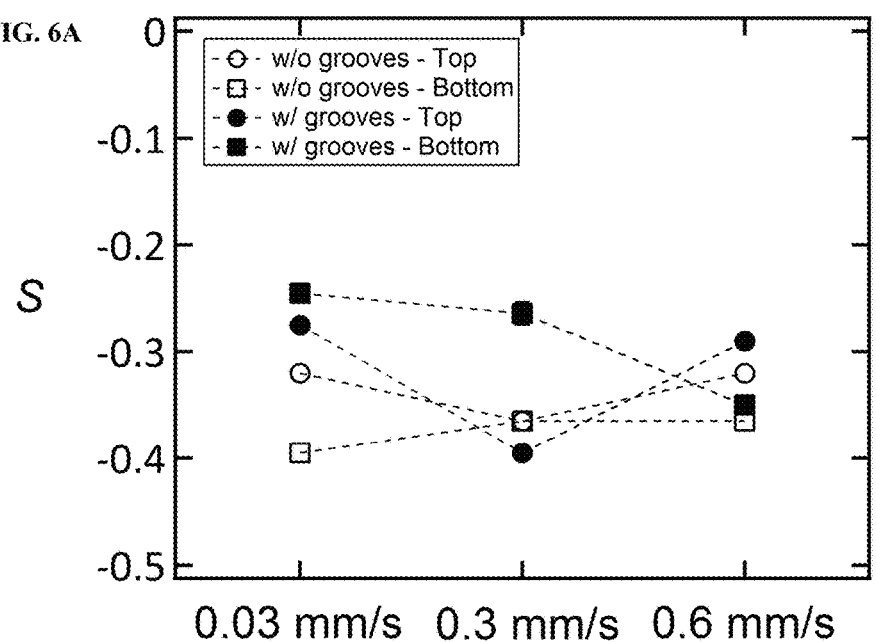
FIG. 6 illustrates the order parameters (FIG. 6A) S and (FIG. 6B) $\eta$ as a function of blade coating rates, in accordance with one or more embodiments of the invention. The order parameters are calculated for the top and bottom-side of the film with and without the presence of nanogrooves. The dashed lines are to the guide the eye.
Figure 6:
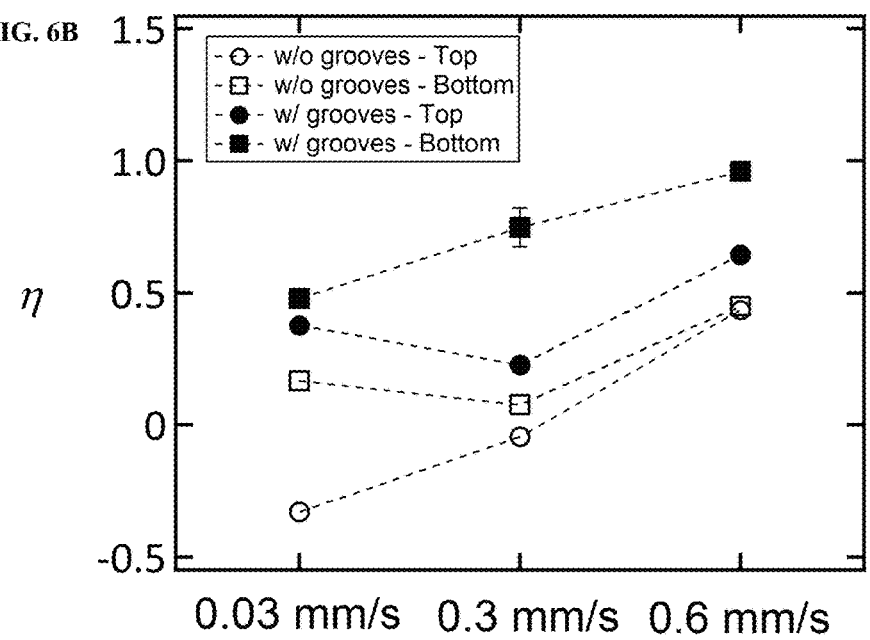
Figure 7:
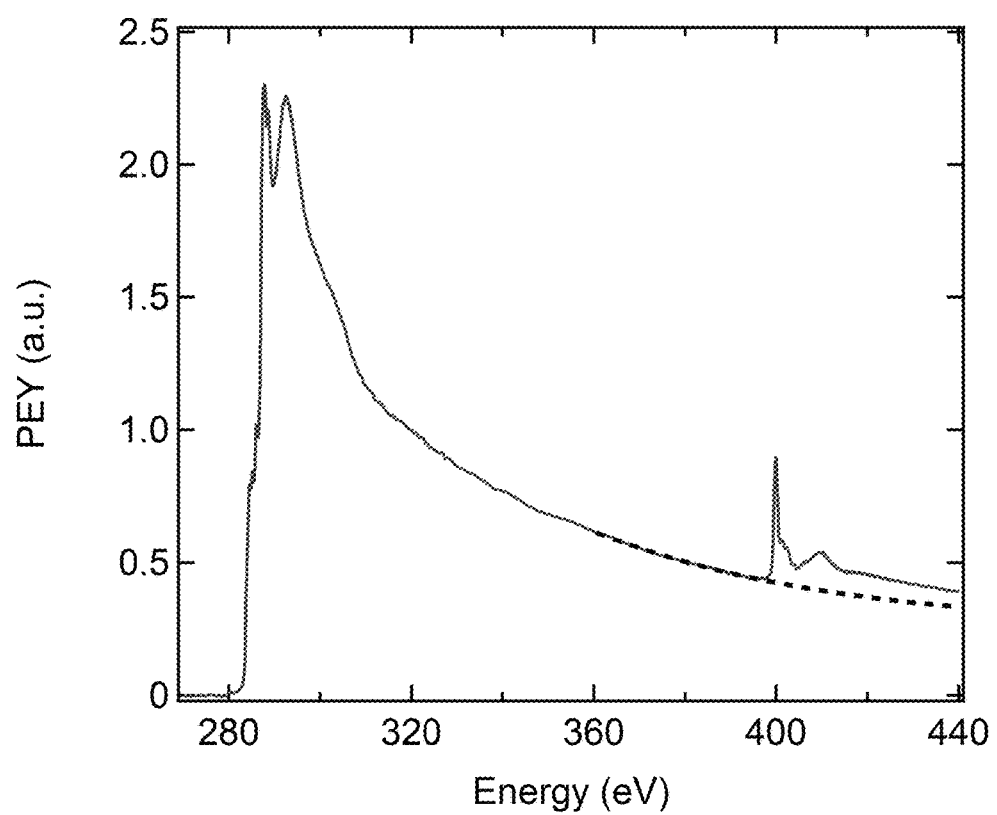
FIG. 7 illustrates the background subtraction for nitrogen-edge normalization, in accordance with one or more embodiments of the invention.

Influence of Nanogrooves and Processing Methods on Biaxial Orientation. In FIG. 6A, the values of S are plotted to show the effects of the nanogrooves and blade coating rates. When films are coated on substrates with nanogrooves, S decreases (more negative) for the bottom-side of the film as the blade-coating rate is increased. On the other hand, without nanogrooves, S tends to be relatively constant for all three blade-coating rates (only a slight increase from 0.03 mm/s to 0.3 mm/s). Also for the bottom-side, the S values are greater with nanogrooves. This difference is greatest at 0.03 mm/s where S=−0.245 with nanogrooves and S=−0.395 without nanogrooves. This trend indicates the presence of nanogrooves results in a slightly less edge-on orientation (especially at 0.03 mm/s and 0.3 mm/s) on the bottom-side. As for the top-side of the film, the presence of the nanogrooves results in a slightly less edge-on orientation at 0.03 mm/s and 0.6 mm/s, but observe no difference at 0.3 mm/s. The S values are comparable at blade coating rates of 0.03 mm/s and 0.6 mm/s, but decrease for 0.3 mm/s for both with and without nanogrooves. The decrease in S is greatest with nanogrooves.

In FIG. 6B, the values of η for the various blade coating rates for the films formed on substrates with and without nanogrooves. Overall, the alignment is best for films blade coated on nanogrooved substrates as indicated by large values of η. For example, for the bottom-side, η=0.748 with nanogrooves while η=0.075 without nanogrooves at 0.3 mm/s. The best alignment occurs at 0.6 mm/s where η=0.96. Therefore, the presence of the nanogrooves is critical for alignment of polymer chains for the blade coating rates used in this study. In addition, higher blade coating rates results in better alignment. For the bottom-side with nanogrooves, η increases from 0.48 to 0.96 at 0.03 mm/s and 0.6 mm/s, respectively. Blade coating rates have the greatest effect for the top-side without nanogrooves where η increases from −0.33 to 0.435 at 0.03 mm/s and 0.6 mm/s, respectively. In addition, the comparison of η between the top- and bottom-side indicates the alignments tend to be better near the substrate interface with nanogrooves. However, the difference was observed to decrease with increasing blade-coating rates without nanogrooves. The extent of alignment at 0.6 mm/s is essentially equal without nanogrooves for the top- and bottom-side (η~0.45).

For a film blade-coated perpendicular to the nanogrooves at a speed of 0.3 mm/s, it was determined that S=−0.463 and η=−0.0439 on the bottom-side. For reference, S=−0.263 and η=0.748 when blade coated parallel to the nanogrooves. So, the perpendicular coating results in film with more preferential edge-on orientation, but has no main-axis alignment with respect to the blade-coating direction. Therefore, blade-coating parallel to the nanogroove direction is important for alignment. The order parameters discussed for all the films have been annealed at 200° C. after blade-coating. For a film that is blade-coated parallel to nanogroove direction at 0.3 mm/s but without annealing, it was calculated that S=−0.181 and η=0.522 on the bottom-side. Therefore, the as-cast blade-coated film does result in a certain degree of orientation. However, the annealing step improves both the backbone title orientation (to S=−0.263) and the orientation of the main-chain axis relative to the nanogrooves (to η=0.748). For liquid crystalline conjugated polymer, annealing films above the nematic liquid crystalline transition temperature is critical in obtained well aligned films. This have seen in the alignment of fluorine-thiophene copolymers on rubbed polyimide surfaces and flow-coated PBTTT. For the disclosed system, the annealing temperature does not correspond to a specific phase transitions (i.e. crystallization or liquid crystalline).[25] The improvement in alignment during annealing most likely occurs just from slight crystallite reorientation.

General Discussion on the Mechanism of Biaxial Orientation. It is clear that the presence of uniaxial nanogrooves and blade coating parallel to the nanogrooves are critical for obtaining aligned films. In addition, faster coating rates (increasing speed and temperature) improve the alignment. Polymer chain aggregation is suspected in the chlorobenzene solution. As a result, these aggregated structures in solution play a role in the film formation. The contact angle at the leading-edge is dictated by interaction of the chlorobenzene and the DTS monolayer, plus the coating speed. Without nanogrooves, the driving forces for alignment are the solution shear force, the evaporation rate, and the solution flux (solvent and polymer aggregates) towards the film formation front. For the top-side of the film, the alignment improves with faster coating speeds due to the greater shear force. On the bottom-side, the shear force may be lower, the interactions with substrate effects the orientation as well. The presence of nanogrooves creates additional driving force for alignment where the nanogrooves may serve as nucleation sites for the crystallization and growth of the fibers. The fibers would ideally grow along the nanogrooves. Increasing coating speeds increases the shear force applied to the solution, thus helping align the polymer aggregate. With the flow parallel to the grooves, the polymer aggregates crystalizes and grow along the nanogrooves. At higher evaporation rates (i.e. increasing coating temperature), the time span for the flux of the polymer aggregates towards film formation is reduced. As a result, the polymer aggregates have less time to move around in solution. The aggregates preferentially align near the nanogrooves. At slower coating speeds, the shear force is lower, thus limiting the orientation of the polymer aggregates. Plus, the slower evaporation rates increase the time the polymer aggregates move in solution.

Conclusions. The molecular orientations of blade coated films of regioregular PCDTPT have been characterized. Overall, blade coating on unidirectional substrates yields well-aligned films. Blade-coated films are semicrystalline and the crystallites orient primarily "edge-on." The characteristic lamellar alkyl side-chain spacing, $d_{100}$,=2.51 nm and the π-π stacking distance, $d_{010}$,=0.35 nm. The orientation of the blade coating films were further characterized using polarization-dependent PEY NEXAFS at the C k-edge and N k-edge. These are the first reported NEXAFS spectra for PCDTPT. The C k-edge spectra consists of several π* resonance signals between 284 eV to 287 eV. Theoretical calculations of the C k-edge spectrum agree with experimental spectrum. In addition, the experimental N k-edge spectrum was in good agreement with the calculated NEXAFS spectrum. Using the calculated spectrum, the peaks at 400 eV and 401.3 eV were assigned as π* transitions, while any peaks above are mixture of π* and σ* transitions or only σ* transitions. Using the calculated spectrum, the σ* transition at 403.6 eV was determined to only correspond to the x-component of transition dipole moment (TDM). This provides an additional route to study alignment in the film. Theoretical calculations of NEXAFS spectra is a powerful tool to predict the absorption spectrum at various k-edges. One may use these calculations to predict the spectrum newly synthesized molecules before running synchrotron experiments.

Consequently, one can plan ahead for experiments and save valuable experimental synchrotron time.

Using the polarization dependence of the NEXAFS N 1 s to π* resonance signal in the parallel and perpendicular configurations, the extent of molecular axis orientation relative to the alignment direction can be determined. In particular, the orders parameters S and η were calculated using the N 1 s to π* transition at ~400 eV. To the best of our knowledge, this is first study to use the N k-edge to study the molecular orientation of a conjugated polymer film. S describes the extent of orientation of the polymer backbone tilt relative to the surface normal (i.e. "edge-on" or "face-on"), while η describes the extent of orientation of the main-chain axis of the polymer relative to the alignment direction. All films were observed to have uniaxial orientation out-of-plane where the conjugated polymer have a preferential "edge-on" orientation (S→−0.5). The presence of uniaxial nanogrooves is critical in obtaining in-plane alignment. Films on nanogrooves substrates always had the best alignment as indicated by the large positive η values. Furthermore, the in-plane alignment is greatest on the bottom-side of films. The best alignment occurs at a more rapid blade coating rate of 0.6 mm/s and T=80° C. (η=0.96 and S=−0.35). However, the alignment is reduced on the top-side of the film relative to bottom-side for all blade coating conditions indicating the alignment is not constant through the thickness of the film. The values of the order parameters indicate that further improvement in alignment can be made in the films (increasing η). Blade coating conditions reported are from the first generation of experiments. Further optimization of the blade coating method will yield even better aligned films. Lastly, the blade coating method on nano-grooved substrates should be applicable to the vast majority of conjugated polymers in order to yield highly aligned films.

Example 3

Delamination of Thin Film Using Dilute Hydrofluoric Acid Solution

To obtain NEXAFS spectra for the bottom-side of the film, 5 wt % hydrofluoric acid (HF) solution was initially used to delaminate the film from the substrate. However, subsequent NEXAFS experiments yielded results that did not resemble the PCDTPT spectrum. Control NEAXFS experiments were performed on thin films of PBTTT and P(NDIOD-T2) which were delaminated using HF (FIGS. 8C and 8D). The NEXAFS spectra are essentially equivalent for all three polymers after HF exposure; especially in the region corresponding to C=C bonds (~284-286 eV). This result suggests that HF solution contains some unsaturated organic compound that contaminates the surface of the film and consequently dominates the NEXAFS spectrum. Alternatively, HF exposure may result in a chemical reaction with the polymer. Any protonation of N atoms was ruled out as the N K-edge NEXAFS spectra before and after HF exposure yields identical results (FIG. 8B). This suggests that the HF does not protonate the pyridal nitrogen atom or thiadiazole nitrogen atoms. The HF effect was not further delved into as it is beyond the scope of this example.

Example 4

Blade Coater Setup

Figure 17:
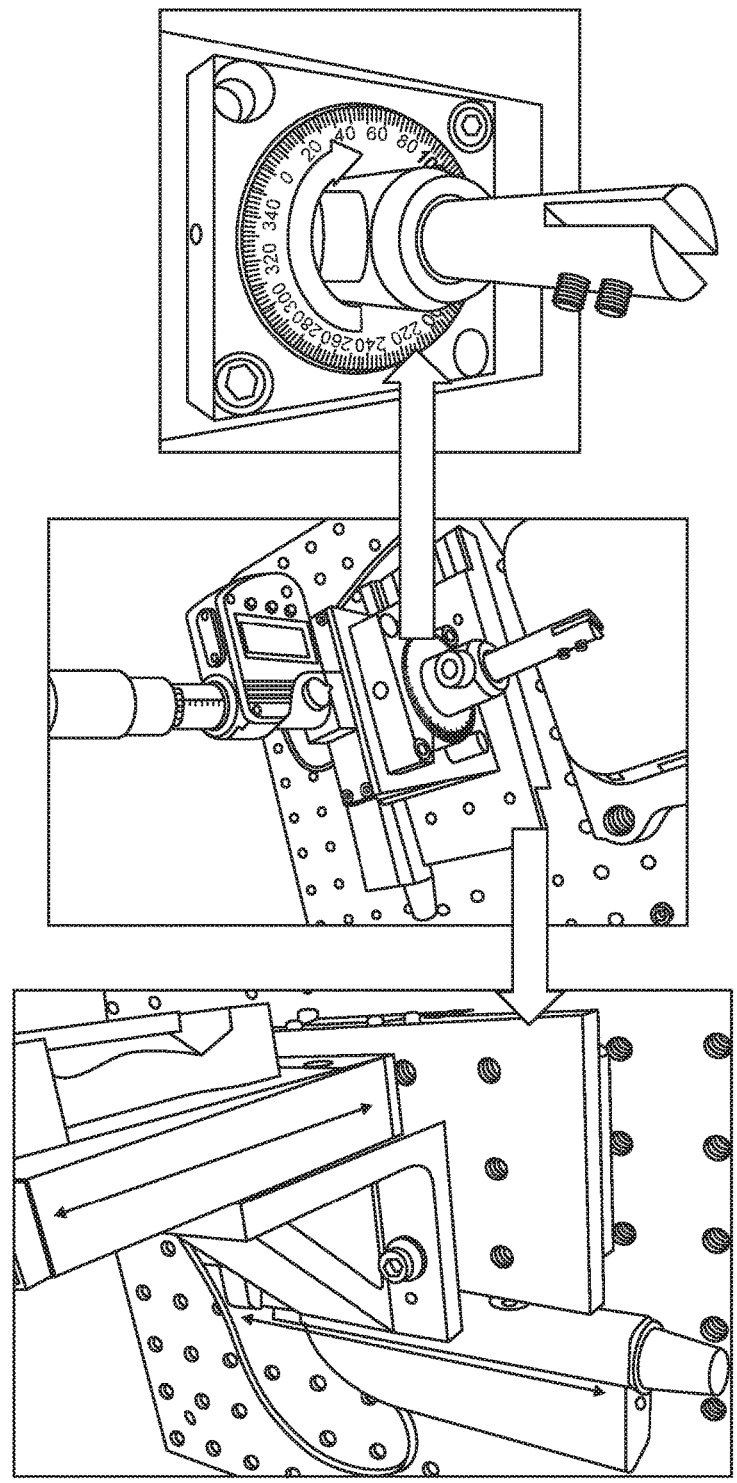
FIG. 17 illustrates an embodiment of a custom-built blade coater setup, in accordance with one or more embodiments of the invention.

A custom blade coater has been built for directional casting of polymer films on uni-directional nano-groove substrates (also referred to as uniaxially scratched substrates). A picture of the blade coater is given in FIG. 17. A motor actuator is connected to a linear translation stage with a travel range of 5 cm. The dc servo motor has a speed range of approximately 1 micron/s to a maximum speed of 5 mm/s. The blade unit is coupled to the motorized translation stage. The blade unit consists of a blade holder, rotational stage, and z-axis manual translation stage to accurately position the stage on the substrate. The blade holder allows for easy connection of various customs blades such as a glass slide or razor blade. The blade can be made of various materials, with various edge profiles and surface coating. The blade material can be metal, ceramic, glass, plastic or composite. The blades may have a beveled or lamella edge profile, or without a beveled or lamella profile typically referred to as square and rounded edge blades. The blades can be surface coated to modify their surface property, for example, to attract or repel the coating solution.

With the rotational stage one can change the angle of the blade. The z-axis translation stage has a manual micrometer actuator to allow for accurate measurements of gap distance between the blade and substrate. Samples are placed on a hot plate for temperature control.

Example 5

Mobility Measurements of Blade-Coated Films

Figure 18:
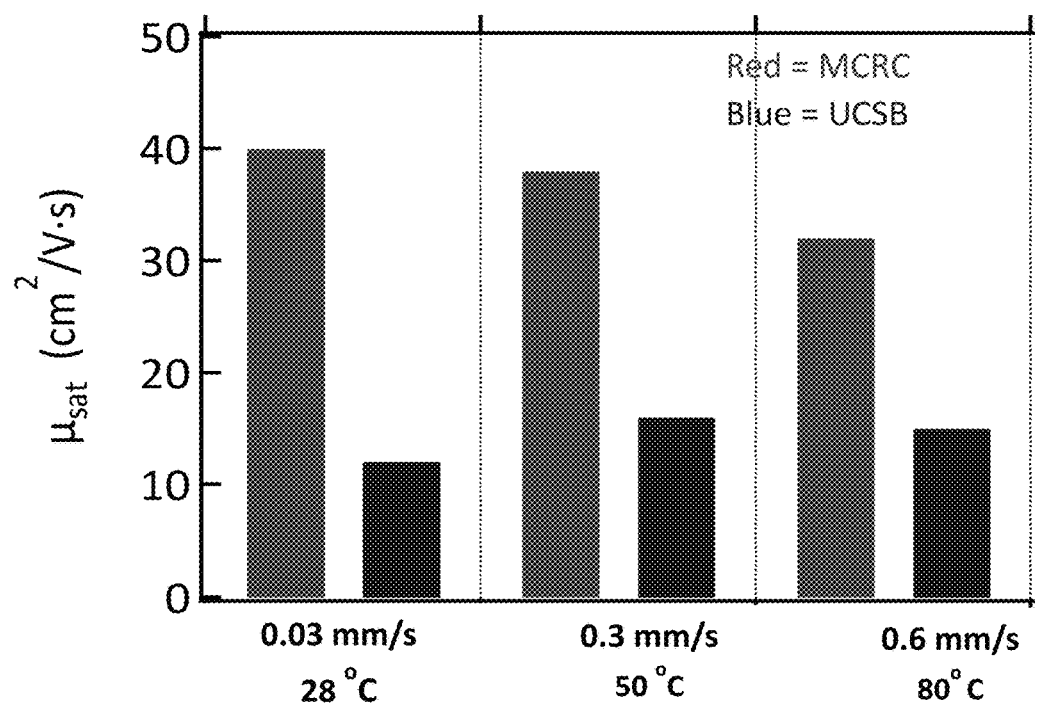
FIG. 18 illustrates saturation mobility measurements of blade-coated films using various polymers, in accordance with one or more embodiments of the invention. Films were coated on nano-grooved substrates and measured parallel to alignment direction.

Field-effect transistor devices (bottom gate, bottom contact) were fabricated using the regioregular PCDTPT copolymer (P2). Films were blade coated on Si/SiO$_2$ (300 nm thermal oxide) with unidirectional nano-grooves to promote polymer chain alignment. Gold contacts were 50 nm thick with a 5 nm Ni adhesion layer. The source/drain channel width was 1 mm and the channel length was varied from 80 μm to 200 μm. The substrates were passivated with decyltrichlorosilane (DTS). Films were blade-coated using the methods described herein. Two P2 polymers were tested (see, FIG. 18). Both had comparable molecular weights (~50 kg/mol) and polydispersity index (~3). Overall, the mobility of the MCRC polymer is better and approaching the values of the sandwich casting method. There does not appear to be any significant variation in mobility at different blade coating conditions. This is surprising because it is clear from the order parameters that the orientation varies between blade coating speeds. Also, it is unclear why the mobility is different from the two polymer batches. The easiest explanation would be the MCRC contains fewer impurities.

However, this needs to be confirmed. Nevertheless, preliminary results indicate good aligned films can be obtained using blade coating and obtain mobility values that are comparable to the sandwich casting method.

Example 6

Order Parameters For Sandwich Casted Films

An aligned film using the sandwich casting method developed by the Heeger group yields order parameters of S=−0.20 and η of 0.67. The sandwich casting order parameters indicate less orientation in the film relative to the optimal blade coating conditions. However, it is not clear if the lower order parameters are a function of coating method or just from the inherent challenge of probing the orientation of a sandwich casted film. The challenge arises from the relatively small film surface area (~7-10 mm$^2$), which makes it difficult to align the incident X-ray beam to the film while rotating the sample. Nevertheless, the NEXAFS experiments provide a reference point for the order parameter for the sandwich casting method.

REFERENCES

Note: This application references a number of different publications as indicated throughout the specification by reference numbers in superscript. A list of these different publications ordered according to these reference numbers can be found below.

All publications mentioned herein are incorporated herein by reference to disclose and describe the methods and/or materials in connection with which the publications are cited. Publications cited herein are cited for their disclosure prior to the filing date of the present application. Nothing here is to be construed as an admission that the inventors are not entitled to antedate the publications by virtue of an earlier priority date or prior date of invention. Further, the actual publication dates may be different from those shown and require independent verification.

[1] Mei, J.; Diao, Y.; Appleton, A. L.; Fang, L.; Bao, Z. Integrated Materials Design of Organic Semiconductors for Field-Effect Transistors. *Journal of the American Chemical Society,* 2013, 135, 6724-6746.

[2] Chen, X. L.; Lovinger, A. J.; Bao, Z.; Sapjeta, J. Morphological and Transistor Studies of Organic Molecular Semiconductors with Anisotropic Electrical Characteristics. *Chem. Mater.* 2001, 13, 1341-1348.

[3] Sirringhaus, H.; Wilson, R. J.; Friend, R. H.; Inbasekaran, M.; Wu, W.; Woo, E. P.; Grell, M.; Bradley, D. D. C. Mobility Enhancement in Conjugated Polymer Field-Effect Transistors through Chain Alignment in a Liquid-Crystalline Phase. *Appl. Phys. Lett.* 2000, 77, 406.

[4] Amundson, K. R.; Sapjeta, B. J.; Lovinger, A. J.; Bao, Z. An in-Plane Anisotropic Organic Semiconductor Based upon poly(3-Hexyl Thiophene). *Thin Solid Films* 2002, 414, 143-149.

[5] Nagamatsu, S.; Takashima, W.; Kaneto, K.; Yoshida, Y.; Tanigaki, N.; Yase, K. Polymer Field-Effect Transistors by a Drawing Method. *Appl. Phys. Lett.* 2004, 84, 4608-4610.

[6] Mas-Torrent, M.; Boer, D. den; Durkut, M.; Hadley, P.; Schenning, A. P. H. J. Field Effect Transistors Based on poly(3-Hexylthiophene) at Different Length Scales. *Nanotechnology* 2004, 15, S265-S269.

[7] Li, S. P.; Newsome, C. J.; Russell, D. M.; Kugler, T.; Ishida, M.; Shimoda, T. Friction Transfer Deposition of Ordered Conjugated Polymer Nanowires and Transistor Fabrication. *Appl. Phys. Lett.* 2005, 87, 062101.

[8] Zheng, Z.; Yim, K.-H.; Saifullah, M. S. M.; Welland, M. E.; Friend, R. H.; Kim, J.-S.; Huck, W. T. S. Uniaxial Alignment of Liquid-Crystalline Conjugated Polymers by Nanoconfinement. *Nano Lett.* 2007, 7, 987-992.

[9] Alcazar, D.; Wang, F.; Swager, T. M.; Thomas, E. L. Gel Processing for Highly Oriented Conjugated Polymer Films. *Macromolecules* 2008, 41, 9863-9868.

[10] Jimison, L. H.; Toney, M. F.; McCulloch, I.; Heeney, M.; Salleo, A. Charge-Transport Anisotropy Due to Grain Boundaries in Directionally Crystallized Thin Films of Regioregular Poly(3-Hexylthiophene). *Adv. Mater.* 2009, 21, 1568-1572.

[11] Delongchamp, D. M.; Kline, R. J.; Jung, Y.; Germack, D. S.; Lin, E. K.; Moad, A. J.; Richter, L. J.; Toney, M. F.; Heeney, M.; Mcculloch, I. Controlling the Orientation of Terraced Nanoscale "Ribbons" of a Poly(thiophene) Semiconductor. *ACS Nano* 2009, 3,780-787.

[12] Vogelsang, J.; Adachi, T.; Brazard, J.; Vanden Bout, D. A.; Barbara, P. F. Self-Assembly of Highly Ordered Conjugated Polymer Aggregates with Long-Range Energy Transfer. *Nat. Mater.* 2011, 10, 942-946.

[13] Lee, M. J.; Gupta, D.; Zhao, N.; Heeney, M.; McCulloch, I.; Sirringhaus, H. Anisotropy of Charge Transport in a Uniaxially Aligned and Chain-Extended, High-Mobility, Conjugated Polymer Semiconductor. *Adv. Funct. Mater.* 2011, 21, 932-940.

[14] Schuettfort, T.; Watts, B.; Thomsen, L.; Lee, M.; Sirringhaus, H.; McNeill, C. R. Microstructure of Polycrystalline PBTTT Films: Domain Mapping and Structure Formation. *ACS Nano* 2012, 6, 1849-1864.

[15] Luzio, A.; Criante, L.; D'Innocenzo, V.; Caironi, M. Control of Charge Transport in a Semiconducting Copolymer by Solvent-Induced Long-Range Order. *Sci. Rep.* 2013, 3, 3425.

[16] Kim, B.-G.; Jeong, E. J.; Chung, J. W.; Seo, S.; Koo, B.; Kim, J. A Molecular Design Principle of Lyotropic Liquid-Crystalline Conjugated Polymers with Directed Alignment Capability for Plastic Electronics. *Nat. Mater.* 2013, 12, 659-664.

[17] Schuettfort, T.; Thomsen, L.; McNeill, C. R. Observation of a Distinct Surface Molecular Orientation in Films of a High Mobility Conjugated Polymer. *J. Am. Chem. Soc.* 2013, 135, 1092-1101.

[18] Biniek, L.; Leclerc, N.; Heiser, T.; Bechara, R.; Brinkmann, M. Large Scale Alignment and Charge Transport Anisotropy of pBTTT Films Oriented by High Temperature Rubbing. *Macromolecules* 2013, 46, 4014-4023.

[19] Biniek, L.; Pouget, S.; Djurado, D.; Gonthier, E.; Tremel, K.; Kayunkid, N.; Zaborova, E.; Crespo-Monteiro, N.; Boyron, O.; Leclerc, N.; et al. High-Temperature Rubbing: A Versatile Method to Align H-Conjugated Polymers without Alignment Substrate. *Macromolecules* 2014, 47, 3871-3879.

[20] Grell, M.; Redecker, M.; Whitehead, K. S.; Bradley, D. D. C.; Inbasekaran, M.; Woo, E. P. Monodomain alignment of thermotropic fluorene copolymers. *Liq. Cryst.* 1999, 26, 1403-1407.

[21] Brinkmann, M.; Wittmann, J.-C. Orientation of Regioregular Poly(3-Hexylthiophene) by Directional Solidification: A Simple Method to Reveal the Semicrystalline Structure of a Conjugated Polymer. *Adv. Mater.* 2006, 18, 860-863.

[22] Tseng, H.-R.; Ying, L.; Hsu, B. B. Y.; Perez, L. A.; Takacs, C. J.; Bazan, G. C.; Heeger, A. J. High Mobility

[23] Tseng, H.-R.; Phan, H.; Luo, C.; Wang, M.; Perez, L. A.; Patel, S. N.; Ying, L.; Kramer, E. J.; Nguyen, T.-Q.; Bazan, G. C.; et al. High-Mobility Field-Effect Transistors Fabricated with Macroscopic Aligned Semiconducting Polymers. *Adv. Mater.* 2014, 26, 2993-2998.

[24] Luo, C.; Kyaw, A. K. K.; Perez, L. A.; Patel, S.; Wang, M.; Grimm, B.; Bazan, G. C.; Kramer, E. J.; Heeger, A. J. General Strategy for Self-Assembly of Highly Oriented Nanocrystalline Semiconducting Polymers with High Mobility. *Nano Lett.* 2014, 14, 2764-2771.

[25] Ying, L.; Hsu, B. B. Y.; Zhan, H.; Welch, G. C.; Zalar, P.; Perez, L. A.; Kramer, E. J.; Nguyen, T.-Q.; Heeger, A. J.; Wong, W.-Y.; et al. Regioregular pyridal[2,1,3]thiadiazole Π-Conjugated Copolymers. *J. Am. Chem. Soc.* 2011, 133, 18538-18541.

[26] Delongchamp, D. M.; Kline, R. J.; Fischer, D. A.; Richter, L. J.; Toney, M. F. Molecular Characterization of Organic Electronic Films. *Adv. Mater.* 2011, 23, 319-337.

[27] McNeill, C. R.; Ade, H. Soft X-Ray Characterisation of Organic Semiconductor Films. *J. Mater. Chem. C* 2013, 1, 187-201.

[28] Sohn, K. E.; Dimitriou, M. D.; Genzer, J.; Fischer, D. A.; Hawker, C. J.; Kramer, E. J. Determination of the Electron Escape Depth for NEXAFS Spectroscopy. *Langmuir* 2009, 25, 6341-6348.

[29] Sirringhaus, H. Device Physics of Solution-Processed Organic Field-Effect Transistors. *Adv. Mater.* 2005, /7,2411-2425.

[30] Schwartz, C. P.; Uejio, J. S.; Saykally, R. J.; Prendergast, D. On the Importance of Nuclear Quantum Motions in near Edge X-Ray Absorption Fine Structure Spectroscopy of Molecules. *J. Chem. Phys.* 2009, 130, 184109.

[31] Perez, L. A.; Zalar, P.; Ying, L.; Schmidt, K.; Toney, M. F.; Nguyen, T. Q.; Bazan, G. C.; Kramer, E. J. Effect of Backbone Regioregularity on the Structure and Orientation of a Donor-Acceptor Semiconducting Copolymer. *Macromolecules* 2014, 47, 1403-1410.

[32] Dhez, O.; Ade, H.; Urquhart, S. G. Calibrated NEXAFS Spectra of Some Common Polymers. *J. Electron Spectros. Relat. Phenomena* 2003, 128, 85-96.

[33] Gliboff, M.; Sulas, D.; Nordlund, D.; deQuilettes, D. W.; Nguyen, P. D.; Seidler, G. T.; Li, X.; Ginger, D. S. Direct Measurement of Acceptor Group Localization on Donor-Acceptor Polymers Using Resonant Auger Spectroscopy. *J. Phys. Chem. C* 2014, 118, 5570-5578.

[34] Hintz, H.; Peisert, H.; Aygül, U.; Latteyer, F.; Biswas, I.; Nagel, P.; Merz, M.; Schuppler, S.; Breusov, D.; Allard, S.; et al. Electronic Structure and Interface Properties of a Model Molecule for Organic Solar Cells. *Chemphyschem* 2010, 11, 269-275.

[35] Stöhr, J.; Samant, M. G. Liquid Crystal Alignment by Rubbed Polymer Surfaces: A Microscopic Bond Orientation Model. *J. Electron Spectros. Relat. Phenomena* 1999, 98-99, 189-207.

[36] Pattison, L. R.; Hexemer, A.; Kramer, E. J.; Krishnan, S.; Petroff, P. M.; Fischer, D. A. Probing the Ordering of Semiconducting Fluorene—Thiophene Copolymer Surfaces on Rubbed Polyimide Substrates by near-Edge X-Ray Absorption Fine Structure. *Macromolecules* 2006, 39, 2225-2231.

[37] Smilgies, D. M.; Li, R.; Giri, G.; Chou, K. W.; Diao, Y.; Bao, Z.; Amassian, A. Look Fast: Crystallization of Conjugated Molecules during Solution Shearing Proved in-Site and in Real Time by X-Ray Scattering. *Phys. Status Solidi—Rapid Res. Lett.* 2013, 7, 177-179.

[38] Stöhr, J.; Outka, D. Determination of Molecular Orientations on Surfaces from the Angular Dependence of near-Edge X-Ray-Absorption Fine-Structure Spectra. *Phys. Rev. B* 1987, 36, 7891-7905.

[39] Gui Bazan, Lei Ying, Ben Hsu, Wen Wen, Hsin-Rong Tsing, Greg Welch. Regioregular Pyridal[2,1,3]thiadiazole π-conjugated Copolymers for Organic Semiconductors. U.S. Ser. No. 13/526,371.

[40] Hsin-Rong Tseng, Lei Ying, Ben Hsu, Christopher Takacs, Gui Bazan, Alan Heeger. Field Effect Transistors Based on Microscopically Oriented Polymers, PCT/US2013/058546.

[41] Chan Luo, Alan Heeger. High Mobility Polymer Thin Film Transistors with Capillary Mediated Self-assembly, U.S. Ser. No. 14/585,653.

CONCLUSION

This concludes the description of typical embodiments of the present invention. The foregoing description of one or more embodiments of the invention has been presented for the purposes of illustration and description. It is not intended to be exhaustive or to limit the invention to the precise form disclosed. Many modifications and variations are possible in light of the above teaching.

All publications, patents, and patent applications cited herein are hereby incorporated by reference in their entirety for all purposes.

What is claimed is:

1. A method for enhancing charge carrier mobility of a field-effect transistor device comprising a charge carrying semiconducting polymer composition, the method comprising:
    generating uniaxial nanogrooves on a substrate; and
    blade coating a solution comprising a semiconducting polymer onto the substrate, wherein the polymer solution is spread onto the substrate in a direction parallel to the nanogrooves and a main-chain axis of the polymer is parallel to the nanogrooves;
    so that polymer is layered on top of the substrate and aligned parallel to a direction of the nanogrooves, thereby enhancing charge carrier mobility of the semiconducting polymer composition in the field-effect transistor device.

2. The method of claim 1, wherein the nanogrooves are formed to provide nucleation sites that enhance the growth of fibers within the polymer solution.

3. The method of claim 1, wherein a tilt, S, of the polymer main-chain axis relative to a normal of the substrate is less than or equal to −0.35 and an orientation, η, of the polymer main-chain axis relative to the alignment direction is greater than or equal to 0.96.

4. The method of claim 2, wherein the polymer crystallizes to form a fiber having a long-axis and a short-axis, and the main-chain axis of the polymer is parallel to the long-axis of the fiber while π-π stacking is in a direction along the short-axis of the fiber.

5. The method of claim 2, wherein the uniaxial nanogrooves are at least 100 nm in width.

6. The method of claim 1 wherein the polymer is a donor-acceptor copolymer of a cyclopenta[2,1-b:3,4-b']dithiophene (CDT) donor unit and a [1,2,5]thiadiazolo[3,4-c]pyridine (PT) acceptor unit.

7. The method of claim 1 wherein blade coating the solution comprises positioning a blade at an at least 60° angle to the substrate and at least 150 μm above the substrate.

8. The method of claim 1, wherein the polymer solution is blade coated onto the substrate at a rate of at least 0.6 mm/s and at a temperature of at least 80° C.

9. The method of claim 1, wherein the polymer film is annealed at a temperature of at least 200° C.

10. The method of claim 7, the annealed polymer film has a thickness between 25-35 nm.

11. The method of claim 1, wherein the semiconducting polymer is annealed to form a polymer film following casting of the semiconducting polymer onto the nanogrooved substrate.

12. The method of claim 1, wherein a surface of the substrate is treated so as to attract or repel the polymer solution; and/or a surface of the blade is treated so as to attract or repel the polymer solution.

13. The method of claim 1, wherein the substrate is maintained at a selected temperature or within a selected temperature range to control aggregation in the solution of the semiconducting polymer.

14. The method of claim 1, wherein the solid film is subsequently thermally treated to improve the order of the semiconducting polymer.

15. The method of claim 1, wherein the solution is delivered using slot die coating.

16. A method for forming semiconducting polymer film on a substrate, the method comprising:
blade coating a solution comprising a semiconducting polymer onto a substrate having uniaxial nanogrooves, wherein the solution is spread onto the substrate in a direction parallel to the nanogrooves such that a main-chain axis of polymers within the solution are parallel to the nanogrooves;
so that the semiconducting polymer film is formed on top of the substrate, wherein said film comprises a plurality of polymer fibers aligned parallel to the uniaxial nanogrooves.

17. The method of claim 16, wherein the uniaxial nanogrooves are at least 25, 50, 75 or 100 nm in width.

18. The method of claim 16, wherein the substrate material is selected to include nanogrooves having nucleation sites for growth of the polymer fibers within the polymer solution.

19. The method of claim 16, wherein a tilt, S, of the polymer main-chain axis relative to a normal of the substrate is less than or equal to −0.35 and an orientation, $f$, of the polymer main-chain axis relative to the alignment direction is greater than or equal to 0.96.

20. The method of claim 19, wherein the polymer crystallizes to form a fiber having a long-axis and a short-axis, and the main-chain axis of the polymer is parallel to the long-axis of the fiber while π-π stacking is in a direction along the short-axis of the fiber.

* * * * *